United States Patent
Kim

(10) Patent No.: US 9,698,827 B2
(45) Date of Patent: Jul. 4, 2017

(54) CONTROLLER, SEMICONDUCTOR MEMORY SYSTEM AND OPERATING METHOD THEREOF

(71) Applicant: SK hynix Inc., Gyeonggi-do (KR)

(72) Inventor: Jae-Bum Kim, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 41 days.

(21) Appl. No.: 14/743,914

(22) Filed: Jun. 18, 2015

(65) Prior Publication Data

US 2016/0246673 A1    Aug. 25, 2016

(30) Foreign Application Priority Data

Feb. 23, 2015   (KR) .......................... 10-2015-0025192

(51) Int. Cl.
```
H03M 13/00     (2006.01)
H03M 13/15     (2006.01)
G06F 11/10     (2006.01)
G11C 29/52     (2006.01)
H03M 13/11     (2006.01)
G11C 16/26     (2006.01)
G11C 11/56     (2006.01)
```
(Continued)

(52) U.S. Cl.
CPC ..... *H03M 13/1575* (2013.01); *G06F 11/1012* (2013.01); *H03M 13/6325* (2013.01); *G11C 11/5642* (2013.01); *G11C 16/26* (2013.01); *G11C 29/52* (2013.01); *G11C 2029/0411* (2013.01); *H03M 13/1102* (2013.01); *H03M 13/152* (2013.01); *H03M 13/1515* (2013.01); *H03M 13/23* (2013.01); *H03M 13/251* (2013.01); *H03M 13/256* (2013.01); *H03M 13/2957* (2013.01)

(58) Field of Classification Search
CPC .. G06F 11/1072; G06F 11/1076; G06F 11/10; G11C 29/52; H03M 13/1575; H03M 13/6325

See application file for complete search history.

(56) References Cited

U.S. PATENT DOCUMENTS 7,197,690 B2   3/2007   Shen et al.
7,370,265 B2   5/2008   Shen et al.
(Continued)

FOREIGN PATENT DOCUMENTS

KR   1020060106041   10/2006
KR   1020080088050   10/2008
(Continued)

OTHER PUBLICATIONS

Wang, J., et al., Soft Information for LDPC Decoding in Flash: Mutual-Information Optimized Quantization, 2011 IEEE Global Telecommunications Conference, Dec. 2011, pp. 1-6.

*Primary Examiner* — Shelly A Chase
(74) *Attorney, Agent, or Firm* — IP & T Group LLP

(57) ABSTRACT

An operating method of a controller that includes: when a first ECC decoding on data read from a semiconductor memory device according to a hard read voltage fails, generating one or more quantization intervals based on the number of unsatisfied syndrome check (USC), which is a result of the first ECC decoding; and performing a second ECC decoding on the data by generating soft read data according to soft read voltages determined by the hard read voltage and the quantization intervals.

20 Claims, 23 Drawing Sheets

(51) Int. Cl.
 *G11C 29/04* (2006.01)
 *H03M 13/23* (2006.01)
 *H03M 13/25* (2006.01)
 *H03M 13/29* (2006.01)

(56) References Cited

U.S. PATENT DOCUMENTS

| | | | |
|---|---|---|---|
| 7,383,487 B2 | 6/2008 | Shen et al. | |
| 7,398,455 B2 | 7/2008 | Eroz et al. | |
| 8,051,355 B2 | 11/2011 | Taubin et al. | |
| 8,156,403 B2* | 4/2012 | Shalvi | G06F 11/1072 |
| | | | 714/764 |
| 8,245,098 B2 | 8/2012 | Han et al. | |
| 8,406,048 B2 | 3/2013 | Yang et al. | |
| 8,464,129 B2 | 6/2013 | Gunnam | |
| 8,484,519 B2 | 7/2013 | Weathers et al. | |
| 8,504,887 B1* | 8/2013 | Varnica | H03M 13/1111 |
| | | | 714/730 |
| 8,644,067 B2 | 2/2014 | Jeon | |
| 8,719,663 B2 | 5/2014 | Li et al. | |
| 2012/0266040 A1* | 10/2012 | Hamkins | H04L 1/005 |
| | | | 714/752 |
| 2013/0139035 A1 | 5/2013 | Zhong et al. | |
| 2014/0223264 A1* | 8/2014 | Zeng | H03M 13/1108 |
| | | | 714/773 |
| 2015/0303948 A1* | 10/2015 | Yoon | G11C 29/52 |
| | | | 714/764 |
| 2015/0331748 A1* | 11/2015 | Cohen | G06F 11/1076 |
| | | | 714/764 |

FOREIGN PATENT DOCUMENTS

| | | |
|---|---|---|
| KR | 1020080088332 | 10/2008 |
| KR | 1020110052530 | 5/2011 |
| KR | 1020120053122 | 5/2012 |
| KR | 1020130006472 | 1/2013 |
| KR | 1020140047740 | 4/2014 |

* cited by examiner

CONTROLLER, SEMICONDUCTOR MEMORY SYSTEM AND OPERATING METHOD THEREOF

CROSS-REFERENCE TO RELATED APPLICATIONS

The present application claims priority of Korean Patent Application No. 10-2015-0025192, filed on Feb. 23, 2015, which is incorporated herein by reference in its entirety.

BACKGROUND

1. Field

Various exemplary embodiments of the present invention relate to a semiconductor design technology and, more particularly, to a controller, a semiconductor memory system, and an operating method thereof.

2. Description of the Related Art

Semiconductor memory devices are generally classified into volatile memory devices, such as Dynamic Random Access Memory (DRAM) and Static RAM (SRAM), and nonvolatile memory devices, such as Read Only Memory (ROM), Mask ROM (MROM), Programmable ROM (PROM), Erasable PROM (EPROM), Electrically EPROM (EEPROM), Ferromagnetic RAM (FRAM), Phase change RAM (PRAM), Magnetoresistive RAM (MRAM), Resistive RAM (RRAM) and flash memory.

Volatile memory devices lose data stored therein when their power supplies are interrupted, whereas nonvolatile memory devices retain data stored therein even when their power supply is interrupted. In particular, flash memory devices are widely used as storage mediums in computer systems due to their high program speed, low power consumption and large data storage capacity.

In nonvolatile memory devices, including flash memory devices, the data state of each memory cell is determined based on the number of bits stored in the memory cell. A memory cell storing 1-bit data per cell is called a single-bit cell or a single-level cell (SLC). A memory cell storing multi-bit data, i.e., 2 or more bit data, per cell is called a multi-bit cell, a multi-level cell (MLC) or a multi-state cell. Multi-bit cells are advantageous for high integration. However, as the number of bits programmed in each memory cell increases, reliability decreases and read failure rates increase.

For example, when k bits are programmed in a memory cell, one of $2^k$ threshold voltages is formed in the memory cell. Due to minute differences between the electrical characteristics of memory cells, the threshold voltages of memory cells programmed with the same data form a threshold voltage distribution. Threshold voltage distributions are therefore based upon memory cells having $2^k$ data values, which corresponds to k-bit information.

However, the voltage window available for threshold voltage distributions is limited. Therefore, as the value k increases, the distance between the threshold voltage distributions must decrease and the adjacent threshold voltage distributions may overlap each other. As the adjacent threshold voltage distributions overlap each other, the data that is read may include multiple error bits.

FIG. 1 is a threshold voltage distribution schematically illustrating program and erase states of a 3-bit multi-level cell (3-bit MLC) nonvolatile memory device.

FIG. 2 is a threshold voltage distribution schematically illustrating program and erase states due to characteristic deterioration of a 3-bit MLC nonvolatile memory device.

In an MLC nonvolatile memory device, e.g., an MLC flash memory device in which k-bit data is programmed in a memory cell, the memory cell may have one of $2^k$ threshold voltage distributions. For example, a 3-bit MLC has one of 8 threshold voltage distributions.

Threshold voltages of memory cells programmed with the same data form a threshold voltage distribution due to characteristic differences between memory cells. In a 3-bit MLC nonvolatile memory device, as illustrated in FIG. 1, threshold voltage distributions having first to seventh program states 'P1' to 'P7' and an erase state 'E' are formed. FIG. 1 shows an ideal case in which threshold voltage distributions do not overlap and have read voltage margins therebetween.

Referring to the flash memory example of FIG. 2, memory cells may experience charge loss over time from the electrons that are lost from the floating gate or tunnel oxide film. This charge loss may accelerate when the tunnel oxide film deteriorates from numerous program and erase operations. Charge loss results in a decrease in the threshold voltages of memory cells. For example, as illustrated in FIG. 2, the threshold voltage distribution may shift to the left as the result of charge loss.

Further, program disturbance, erase disturbance and/or back pattern dependency also cause increases in threshold voltages. As the characteristics of memory cells deteriorate, as described above, threshold voltage distributions of adjacent states may overlap, as illustrated in FIG. 2.

Once threshold voltage distributions overlap, read data may have a significant number of errors when a particular read voltage is applied to a selected word line. For example, when a sensed state of a memory cell according to a read voltage Vread3 (i.e. the voltage read from the memory cell) that is applied to a selected word line is on, the memory cell is determined to have a second program state 'P2'. When a sensed state of a memory cell according to a read voltage Vread3 applied to a selected word line is off, the memory cell is determined to have a third program state 'P3'. However, when threshold voltage distributions overlap, the memory cell, which actually has the third program state 'P3', may be erroneously determined to have the second program state 'P2'. In short, when the threshold voltage distributions overlap as illustrated in FIG. 2, read data (i.e. data which is read from a memory cell) may include a significant number of errors.

What is therefore required is a scheme for precisely determining optimal read voltages for data stored in memory cells of a semiconductor memory device.

SUMMARY

Various embodiments of the present invention are directed to a controller, a semiconductor memory system, and an operating method thereof capable of precisely determining optimal read voltages for data stored in memory cells.

In accordance with an embodiment of the present invention, an operating method of a controller may include: when a first ECC decoding on data read from a semiconductor memory device according to a hard read voltage fails, generating one or more quantization intervals based on the number of unsatisfied syndrome check (USC), which is a result of the first ECC decoding; and performing a second ECC decoding on the data by generating soft read data according to soft read voltages determined by the hard read voltage and the quantization intervals.

Preferably, the first ECC decoding may be a low density parity check (LDPC) decoding.

Preferably, the USC may be a nonzero element of a vector generated by a syndrome check of the LDPC decoding.

Preferably, the first ECC decoding may include: performing the LDPC decoding by reading the data from the semiconductor memory device according to the hard read voltage; and determining whether the first ECC decoding is successful based on the USC included in the vector generated by the syndrome check.

Preferably, the quantization intervals may be generated based on the number of USC according to following equation.

$$\Delta_i = a \times USC_{V1} + b \text{ [step]} \quad \text{[USC Number Equation]}$$

wherein "$\Delta_i$" represents one of the quantization intervals, "i" represents an index for the quantization intervals, "$USC_{V1}$" represents the number of USC, and "a" and "b" are coefficient values obtained through a heuristic approach or from device characteristics of the semiconductor memory device.

Preferably, the quantization intervals may be generated based on a quantization interval table having the number of USC as its index and be preset by the equation, above.

Preferably, the second ECC decoding may be performed on the data read from the semiconductor memory device according to the soft read voltages, each of which is spaced apart in voltage level from the hard read voltage by a corresponding one of the quantization intervals.

Preferably, the second ECC decoding may be performed on the data read from the semiconductor memory device according to each of the soft read voltages until the second ECC decoding is successful.

Preferably, the first ECC decoding may be a hard decision decoding, and the second ECC decoding may be a soft decision decoding.

In accordance with an embodiment of the present invention, a controller may include: a means for generating one or more quantization intervals based on the number of unsatisfied syndrome check (USC), which is a result of a first ECC decoding on data read from a semiconductor memory device according to a hard read voltage, when the first ECC decoding fails; and a means for performing a second ECC decoding on the data by generating soft read data according to soft read voltages determined by the hard read voltage and the quantization intervals.

Preferably, the first ECC decoding may be a low density parity check (LDPC) decoding.

Preferably, the USC may be a nonzero element of a vector generated by a syndrome check of the LDPC decoding.

Preferably, the controller may further include: a means for performing the LDPC decoding by reading the data from the semiconductor memory device according to the hard read voltage; and means for determining whether the first ECC decoding is successful based on the USC included in the vector generated by the syndrome check.

Preferably, the means for generating the quantization intervals may generate the quantization intervals based on the number of USC according to following equation.

$$\Delta_i = a \times USC_{V1} + b \text{ [step]} \quad \text{[Quantization Interval Equation]}$$

wherein "$\Delta_i$" represents one of the quantization intervals, "i" represents index for the quantization intervals, "$USC_{V1}$" represents the number of USC, and "a" and "b" are coefficient values are obtained through a heuristic approach or from device characteristics of the semiconductor memory device.

Preferably, the means for generating the quantization intervals may generate the quantization intervals based on a quantization interval table having the number of USC as its index and be preset by the Quantization Interval Equation.

Preferably, the means for performing the second ECC decoding may perform the second ECC decoding on the data read from the semiconductor memory device according to the soft read voltages, each of which is spaced apart in voltage level from the hard read voltage by a corresponding one of the quantization intervals.

Preferably, the means for performing the second ECC decoding may perform the second ECC decoding on the data read from the semiconductor memory device according to each of the plurality of soft read voltages until the second ECC decoding is successful.

Preferably, the first ECC decoding may be a hard decision decoding, and the second ECC decoding may be a soft decision decoding.

In accordance with an embodiment of the present invention, a semiconductor memory system may include: a semiconductor memory device and a controller. The controller may include: a means for generating one or more quantization intervals based on the number of unsatisfied syndrome check (USC), which is a result of a first ECC decoding on data read from the semiconductor memory device according to a hard read voltage, when the first ECC decoding fails; and a means for performing a second ECC decoding on the data by generating soft read data according to soft read voltages determined by the hard read voltage and the quantization intervals.

Preferably, the USC may be a nonzero element of a vector generated by a syndrome check of a low density parity check (LDPC) decoding.

In accordance with various embodiments of the present invention, an optimal read voltage for data stored in memory cell of a semiconductor memory device may be effectively determined.

DETAILED DESCRIPTION

Figure 1:
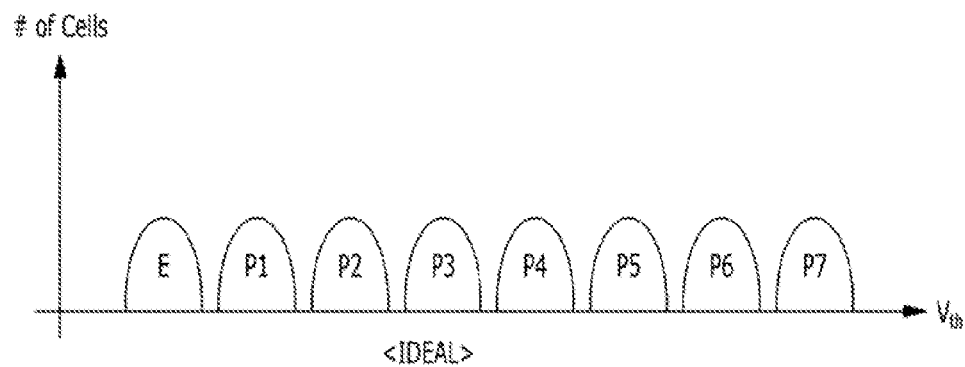
FIG. 1 is a threshold voltage distribution schematically illustrating program and erase states of a 3-bit multi-level cell (3-bit MLC) nonvolatile memory device.
Figure 2:
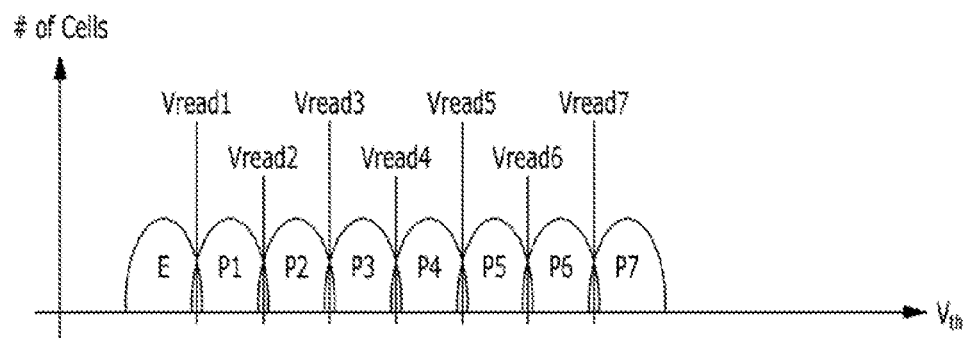
FIG. 2 is a threshold voltage distribution schematically illustrating program and erase states due to characteristic deterioration of a 3-bit MLC nonvolatile memory device.

Various embodiments will be described below in more detail with reference to the accompanying drawings. The present invention may, however, be embodied in different forms and should not be construed as limited to the embodiments set forth herein. Rather, these embodiments are provided so that this disclosure will be thorough and complete and will fully convey the scope of the present invention to those skilled in the art. The drawings are not necessarily to scale and, in some instances, proportions may have been exaggerated in order to clearly illustrate features of the embodiments. Throughout the disclosure, reference numerals correspond directly to the like parts in the various figures and embodiments of the present invention. It is also noted that in this specification, "connected/coupled" refers to one component not only directly coupling another component but also indirectly coupling another component through an intermediate component. In addition, a singular form may include a plural form as long as it is not specifically mentioned in a sentence. It should be readily understood that the meaning of "on" and "over" in the present disclosure should be interpreted in the broadest manner such that "on" means not only "directly on" but also "on" something with an intermediate feature(s) or a layer(s) therebetween, and that "over" means not only directly on top but also on top of something with an intermediate feature(s) or a layer(s) therebetween. When a first layer is referred to as being "on" a second layer or "on" a substrate, it not only refers to where the first layer is formed directly on the second layer or the substrate but to where a third layer exists between the first layer and the second layer or the substrate.

Figure 3:
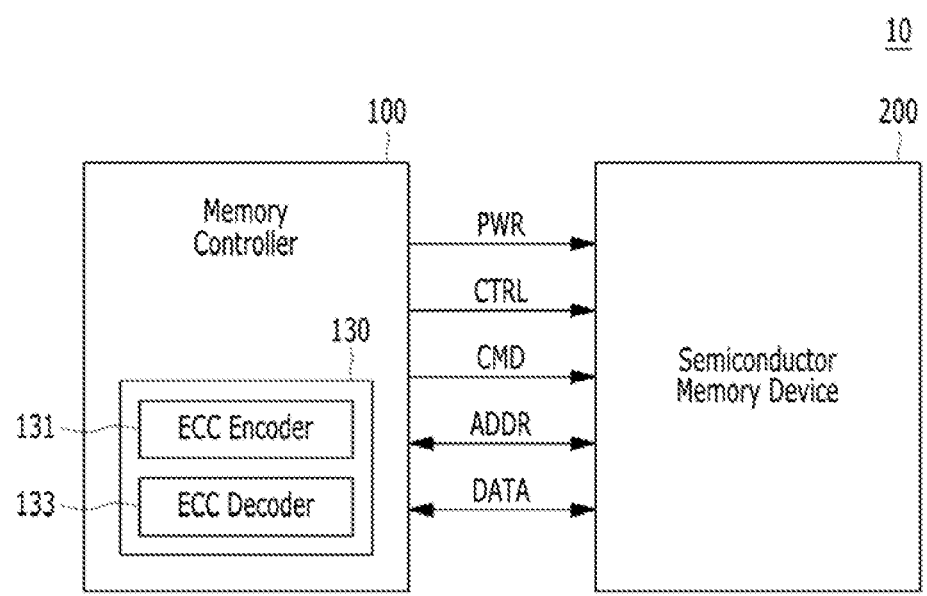
FIG. 3 is a block diagram schematically illustrating a semiconductor memory system in accordance with an embodiment of the present invention.

FIG. 3 is a block diagram schematically illustrating a semiconductor memory system 10 in accordance with an embodiment of the present invention.

Figure 4A:
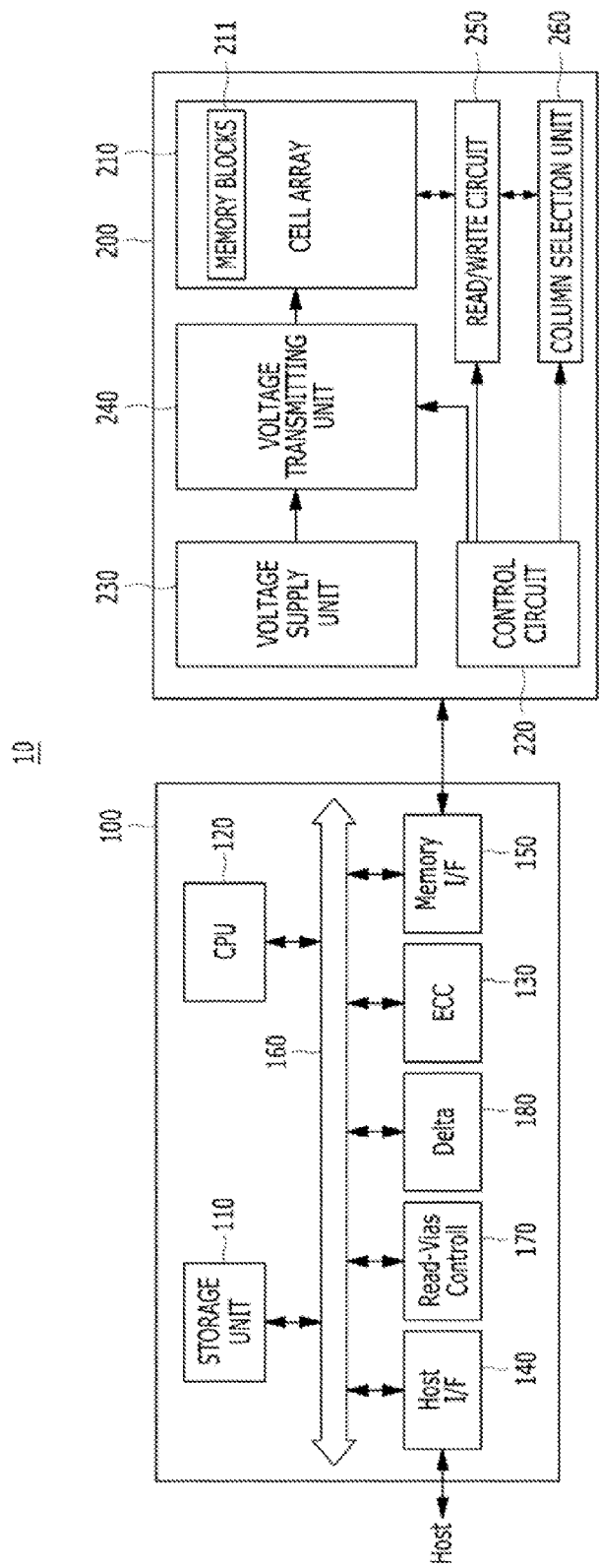
FIG. 4A is a detailed block diagram illustrating the semiconductor memory system shown in FIG. 3.

FIG. 4A is a detailed block diagram illustrating the semiconductor memory system 10 shown in FIG. 3.

Figure 4B:
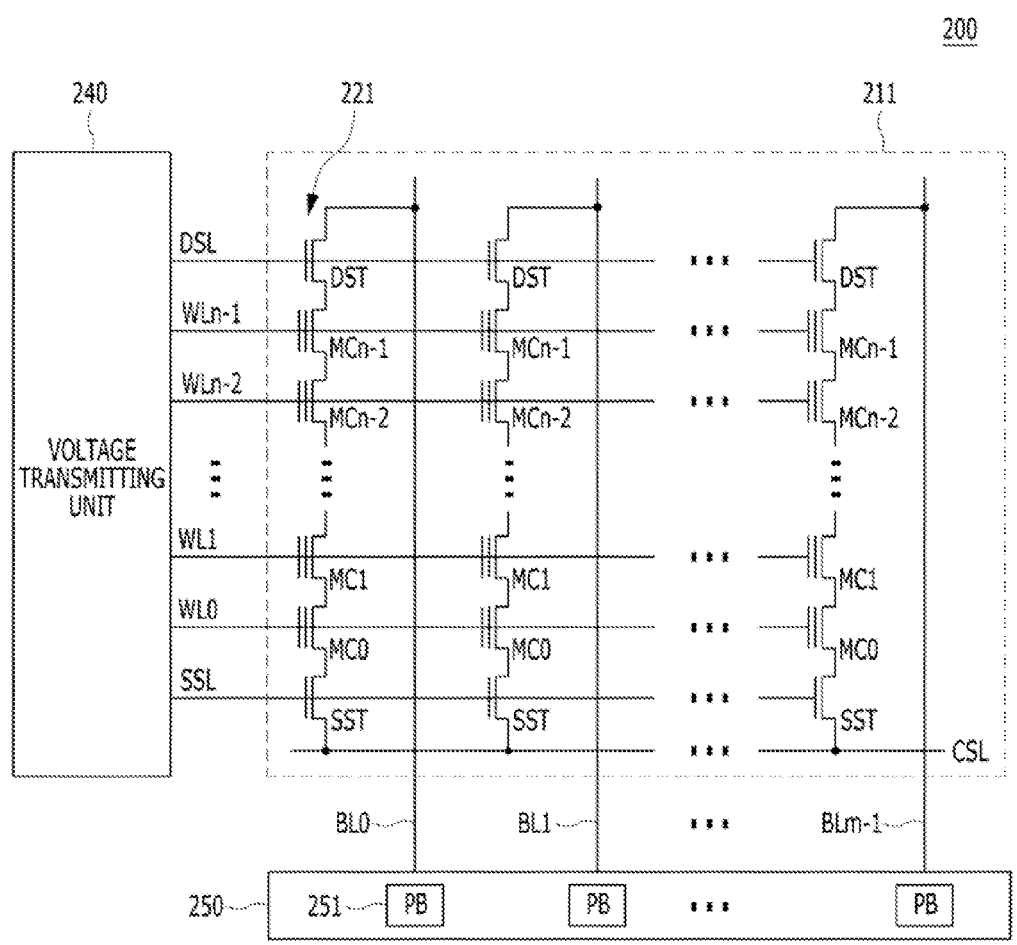
FIG. 4B is a circuit diagram illustrating a memory block shown in FIG. 4A.

FIG. 4B is a circuit diagram illustrating a memory block 211 shown in FIG. 4A.

Figure 5:
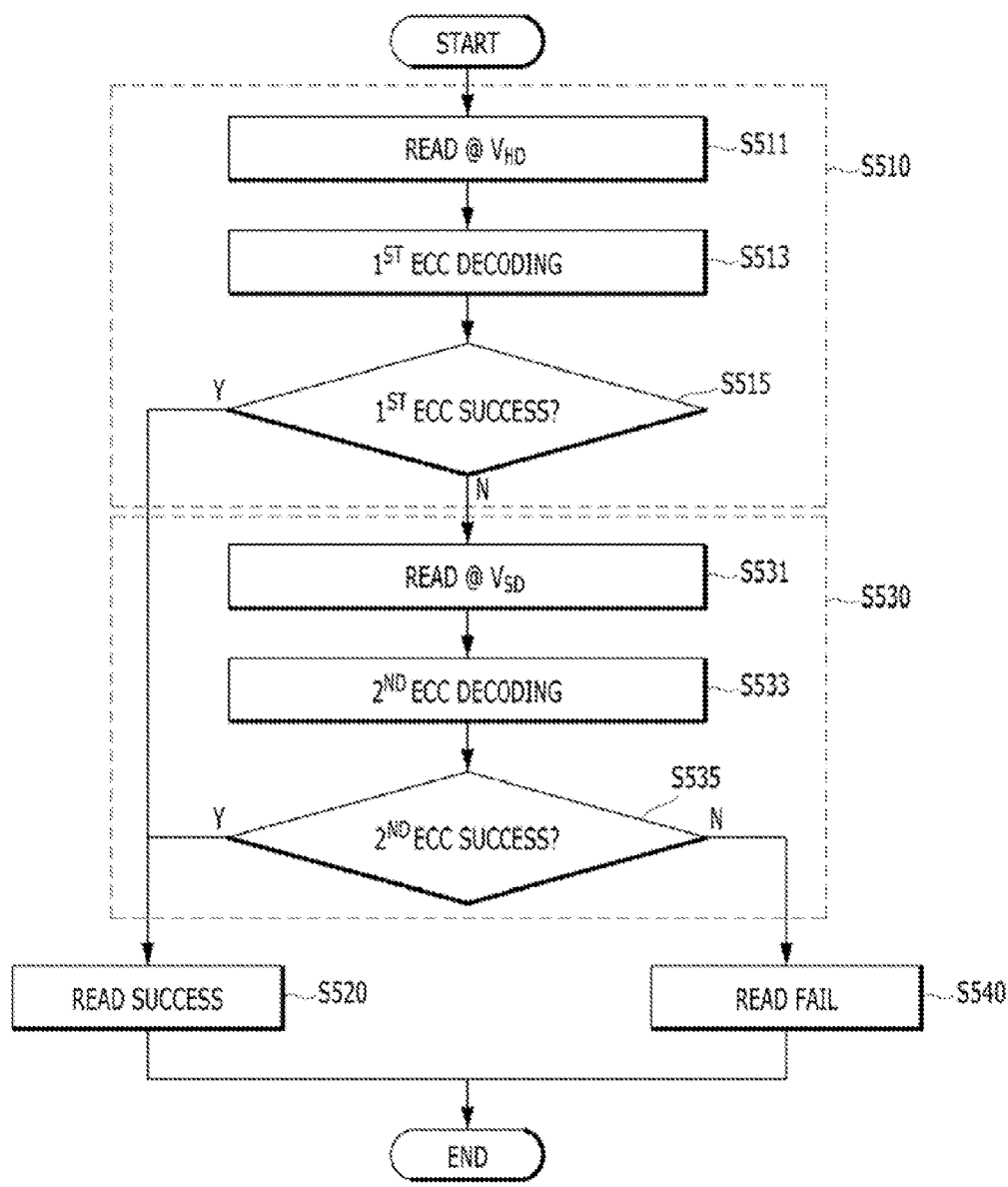
FIG. 5 is a flowchart illustrating an operation of a memory controller shown in FIG. 4A.

FIG. 5 is a flowchart illustrating an operation of a memory controller 100 shown in FIG. 4A.

Referring FIGS. 3 to 5, the semiconductor memory system 10 may include a semiconductor memory device 200 and the memory controller 100.

The semiconductor memory device 200 may perform one or more erase, program, and read operations under the control of the memory controller 100. The semiconductor memory device 200 may receive a command CMD, an address ADDR and data DATA through input/output lines. The semiconductor memory device 200 may receive power PWR through a power line and a control signal CTRL through a control line. The control signal may include a command latch enable (CLE) signal, an address latch enable (ALE) signal, a chip enable (CE) signal, a write enable (WE) signal, a read enable (RE) signal, and so on.

The memory controller 100 may control overall operations of the semiconductor memory device 200. The memory controller 100 may include an ECC unit 130 for correcting error bits. The ECC unit 130 may include an ECC encoder 131 and an ECC decoder 133.

The ECC encoder 131 may perform error correction encoding on data to be programmed into the semiconductor memory device 200 to output data to which parity bits are added. The parity bits may be stored in the semiconductor memory device 200.

The ECC decoder 133 may perform error correction decoding on data read from the semiconductor memory device 200. The ECC decoder 133 may determine whether the error correction decoding is successful, and may output an instruction signal based on the determination result. The ECC decoder 133 may correct error bits of data using parity bits generated by the ECC encoding.

When the number of error bits exceeds error correction capacity of the ECC unit 130, the ECC unit 130 may not correct the error bits. In this case, the ECC unit 130 may generate an error correction fail signal.

The ECC unit 130 may correct an error through a coded modulation such as a low-density parity-check (LDPC) code, a Bose-Chaudhuri-Hocquenghem (BCH) code, a turbo code, a Reed-Solomon (RS) code, a convolution code, a Recursive Systematic Code (RSC), a Trellis-Coded Modulation (TCM), a Block Coded Modulation (BCM), and so on. The ECC unit 130 may include all circuits, systems, or devices for error correction.

In accordance with the embodiment of the present invention, the ECC unit 130 may perform an error bit correcting operation using hard read data and soft read data.

The controller 100 and the semiconductor memory device 200 may be integrated in a single semiconductor device. For example, the controller 100 and the semiconductor memory device 200 may be integrated in a single semiconductor device such as a solid-state drive (SSD). The solid state drive may include a storage device for storing data therein. When the semiconductor memory system 10 is used in an SSD, operation speed of a host (not shown) coupled to the semiconductor memory system 10 may remarkably improve.

The controller 100 and the semiconductor memory device 200 may be integrated in a single semiconductor device such as a memory card. For example, the controller 100 and the semiconductor memory device 200 may be integrated in a single semiconductor device to configure a memory card such as a PC card of personal computer memory card international association (PCMCIA), a compact flash (CF)

card, a smart media (SM) card, a memory stick, a multimedia card (MMC), a reduced-size multimedia card (RS-MMC), a micro-size version of MMC (MMCmicro), a secure digital (SD) card, a mini secure digital (miniSD) card, a micro secure digital (microSD) card, a secure digital high capacity (SDHC), and a universal flash storage (UFS).

For another example, the semiconductor memory system 10 may be provided as one of various elements comprising an electronic device such as a computer, an ultra-mobile PC (UMPC), a workstation, a net-book computer, a personal digital assistants (PDA), a portable computer, a web tablet PC, a wireless phone, a mobile phone, a smart phone, an e-book reader, a portable multimedia player (PMP), a portable game device, a navigation device, a black box, a digital camera, a digital multimedia broadcasting (DMB) player, a 3-dimensional television, a smart television, a digital audio recorder, a digital audio player, a digital picture recorder, a digital picture player, a digital video recorder, a digital video player, a storage device of a data center, a device capable of receiving and transmitting information in a wireless environment, one of electronic devices of a home network, one of electronic devices of a computer network, one of electronic devices of a telematics network, an radio-frequency identification (RFID) device, or elements devices of a computing system.

Referring to FIG. 4A, the memory controller 100 may include a storage unit 110, a CPU 120, the ECC unit 130, a host interface 140, a memory interface 150, a system bus 160, a read bias control unit 170 and a quantization interval generation unit 180. The storage unit 110 may operate as a working memory of the CPU 120.

The host interface 140 may communicate with a host through one or more of various interface protocols such as a universal serial bus (USB), a multi-media card (MMC), a peripheral component interconnect express (PCI-E), a small computer system interface (SCSI), a serial-attached SCSI (SAS), a serial advanced technology attachment (SATA), a parallel advanced technology attachment (PATA), an enhanced small disk interface (ESDI), and an integrated drive electronics (IDE).

The ECC unit 130 may detect and correct an error included in the data read from the semiconductor memory device 200. The memory interface 150 may interface with the semiconductor memory device 200. The CPU 120 may perform various control operations.

The read bias control unit 170 may determine a soft read voltage $V_i$ of current index based on a predetermined hard read voltage $V_1$ and a quantization interval $\Delta_i$ of the current index.

The quantization interval generation unit 180 may determine the quantization interval $\Delta_i$ of the current index.

The semiconductor memory device 200 may include a memory cell array 210, a control circuit 220, a voltage supply unit 230, a voltage transmitting unit 240, a read/write circuit 250, and a column selection unit 260.

The memory cell array 210 may include a plurality of memory blocks 211. User data may be stored in the memory block 211.

Referring to FIG. 4B, the memory block 211 may include a plurality of cell strings 221 coupled to bit lines BL0 to BLm−1, respectively. The cell string 221 of each column may include one or more drain selection transistors DST and one or more source selection transistors SST. A plurality of memory cells or memory cell transistors may be serially coupled between the selection transistors DST and SST. Each of the memory cells MC0 to MCn−1 may be formed of a multi-level cell (MLC) storing data information of multiple bits in each cell. The cell strings 221 may be electrically coupled to the corresponding bit lines BL0 to BLm−1, respectively.

FIG. 4B exemplarily illustrates a memory block 211 comprising a NAND-type flash memory cell. However, the memory block 211 of the semiconductor memory device 200 are not limited to NAND flash memory, but may comprise NOR-type flash memory, hybrid flash memory in which two or more types of memory cells are combined, and one-NAND flash memory in which a controller is embedded inside a memory chip. Operation characteristics of the semiconductor device may be applied to a charge trap flash (CTF) in which a charge storing layer is formed by an insulating layer, as well as the flash memory device in which a charge storing layer is formed by a conductive floating gate.

Referring back to FIG. 4A, the control circuit 220 may control overall operations related to program, erase, and read operations of the semiconductor memory device 200.

The voltage supply unit 230 may provide word line voltages, for example, a program voltage, a read voltage, and a pass voltage, to the respective word lines according to an operation mode, and may provide a voltage to be supplied to a bulk, for example, a well region in which the memory cells are formed. A voltage generating operation of the voltage supply circuit 230 may be performed under control of the control circuit 220.

The voltage supply unit 230 may generate a multiple variable read voltages for generating read data.

The voltage transmitting unit 240 may select one of the memory blocks 211 or sectors of the memory cell array 210, and may select one of the word lines of the selected memory block under the control of the control circuit 220. The voltage transmitting unit 240 may provide the word line voltage generated from the voltage supply circuit 230 to the selected word line or non-selected word lines under the control of the control circuit 220.

The read/write circuit 250 may be controlled by the control circuit 220 and may operate as a sense amplifier or a write driver according to an operation mode. For example, during a verification/normal read operation, the read/write circuit 250 may operate as a sense amplifier for reading data from the memory cell array 210. During the normal read operation, the column selection unit 260 may output the data read from the read/write circuit 250 to the outside, for example, the memory controller 100, based on column address information. On the other hand, during the verification read operation, the read data may be provided to a pass/fail verification circuit (not illustrated) included in the semiconductor memory device 200, and be used for determining whether a program operation of the memory cell succeeds.

During the program operation, the read/write circuit 250 may operate as a write driver for driving the bit lines according to data to be stored in the memory cell array 210. During the program operation, the read/write circuit 250 may receive the data to be written in the memory cell array 210 from a buffer (not illustrated), and may drive the bit lines according to the input data. To this end, the read/write circuit 250 may include a plurality of page buffers (PB) 251 corresponding to the columns (or the bit lines) or column pairs (or bit line pairs), respectively. A plurality of latches may be included in each of the page buffers 251.

Referring to FIGS. 4A to 5, an operation of the memory controller 100 is explained in detail. The operation of the memory controller 100 may include a first ECC decoding step S510, and may additionally include a second ECC decoding step S530.

The first ECC decoding step S510 may include a hard decision ECC decoding on data of predetermined length, which is read from a memory cell of the memory block 211 in response to hard read voltages $V_{HD}$. The first ECC decoding step S510 may include steps S511 to S515.

The second ECC decoding step S530 may include a soft decision ECC decoding on the data by generating soft read data according to soft read voltages $V_{SD}$ corresponding to a predetermined hard read voltage $V_{HD}$, when the hard decision ECC decoding of the first ECC decoding step S510 finally fails. The second ECC decoding step S530 may include steps S531 to S535.

At step S511, the data may be read from the semiconductor memory device 200 according to the hard read voltages $V_{HD}$. The memory controller 100 may provide a read command and an address to the semiconductor memory device 200. The semiconductor memory device 200 may perform a read operation on the data therefrom, corresponding to the hard read voltages $V_{HD}$, in response to the read command and the address. The read data may be provided to the memory controller 100.

At step S513, the hard decision ECC decoding as the first ECC decoding may be performed. The ECC unit 130 may perform the hard decision ECC decoding on the data (hereinafter "hard read data"), which is read from the semiconductor memory device 200 according to the hard read voltages $V_{HD}$ at step S511, based on an error correction code.

At step S515, it may be determined whether the hard decision ECC decoding succeeds or fails. That is, at step S515, it may be determined whether an error of the hard read data, on which the hard decision ECC decoding is performed at step S513, is corrected. For example, the memory controller 100 may determine whether an error of the hard read data, on which the hard decision ECC decoding is performed at step S513, is corrected based on the hard read data and a parity check matrix. When a product result of the parity check matrix and the hard read data, on which the hard decision ECC decoding is performed at step S513, is a zero vector ('0'), it may be determined that the hard read data, on which the hard decision ECC decoding is performed, is corrected. On the other hand, when the product result of the parity check matrix and the hard read data, on which the hard decision ECC decoding is performed, is not the zero vector ('0'), it may be determined that the hard read data, on which the hard decision ECC decoding is performed, is not corrected. The process with the parity check matrix will be described with reference to FIGS. 6A to 6C.

When it is determined that the hard read data, on which the hard decision ECC decoding is performed, is corrected at step S515 (Y), it may be determined that the read operation in response to the hard read voltages $V_{HD}$ at step S511 is successful at step S520 and the operation of the memory controller 100 may end. The hard read data, on which the hard decision ECC decoding is performed at step S513, may be the error-corrected data and may be provided to outside (e.g. to a host or external device) or used in the memory controller 100.

When it is determined that the hard read data, on which the hard decision ECC decoding is performed, is not corrected at step S515 (N), the second ECC decoding step S530 may be performed.

At step S531, the data may be read from the semiconductor memory device 200 according to the soft read voltages $V_{SD}$. For example, an additional read operation according to the soft read voltages $V_{SD}$ may be performed on the memory cell on which the first ECC decoding step S510, according to the hard read voltages $V_{HD}$, is performed. The soft read voltages $V_{SD}$ may have different voltages than the hard read voltages $V_{HD}$.

At step S533, the soft decision ECC decoding as the second ECC decoding may be performed. The soft decision ECC decoding may be performed based on soft read data as well as the hard read data, on which the hard decision ECC decoding is performed at step S513, and the data read from the memory cell according to the soft read voltages $V_{SD}$ at step S531. The hard read voltages $V_{HD}$ and the soft read voltages $V_{SD}$ may have different voltages.

For example, each of the memory cells MC0 to MCn−1 of the semiconductor memory device 200 may belong to one of the threshold voltage distributions including first to seventh program states 'P1' to 'P7' and an erase state 'E'.

Each of the hard read voltages $V_{HD}$ may be between adjacent two states selected from the first to seventh program states 'P1' to 'P7' and the erase state 'E'. Each of the soft read voltages $V_{SD}$ may be between adjacent two states selected from the first to seventh program states 'P1' to 'P7' and the erase state 'E', which is different from the hard read voltages $V_{HD}$.

The hard read data read from the memory cells MC0 to MCn−1 in response to the hard read voltages $V_{HD}$ and the soft read data read therefrom according to the soft read voltages $V_{SD}$ may have different values from each other. For example, there may be a tailing memory cell in the memory cells MC0 to MCn−1 having a threshold voltage outside the threshold voltage distribution of a normal logic state. The hard read data read from the tailed memory cell according to the hard read voltages $V_{HD}$ and the soft read data read therefrom according to the soft read voltages $V_{SD}$ may have different values from each other. When the additional read operation according to the soft read voltages $V_{SD}$ is performed subsequently to the read operation according to the hard read voltages $V_{HD}$, additional information on the threshold voltages of the memory cells MC0 to MCn−1, i.e., information on the tailed memory cell, may be obtained.

When the additional information is obtained, the probability of whether the data of the memory cells MC0 to MCn−1 belong to a first state, e.g., '1', or a second state, e.g., '2', may increase. That is, the reliability of the ECC decoding may increase. The memory controller 100 may perform the soft decision ECC decoding based on the hard read data according to the hard read voltages $V_{HD}$ and the soft read data according to the soft read voltages $V_{SD}$. The relationship between the hard read voltages $V_{HD}$ and the soft read voltages $V_{SD}$ will be described with reference to FIGS. 7A and 7B.

At step S535, it may be determined whether the soft decision ECC decoding succeeds or fails. That is, at step S535, it may be determined whether an error of the soft read data, on which the soft decision ECC decoding is performed at step S533, is corrected. For example, the memory controller 100 may determine whether an error of the soft read data, on which the soft decision ECC decoding is performed at step S533, is corrected based on the soft read data and the parity check matrix. When a product result of the parity check matrix and the soft read data, on which the soft decision ECC decoding is performed at step S533, is the zero vector ('0'), it may be determined that the soft read data, on which the soft decision ECC decoding is performed, is corrected. On the other hand, when the product result of the parity check matrix and the soft read data, on which the soft decision ECC decoding is performed, is not the zero vector ('0'), it may be determined that the soft read data, on which the soft decision ECC decoding is performed, is not corrected. The process with the parity check matrix will be described with reference to FIGS. 6A to 6C.

The product process of the parity check matrix and the hard read data during the first ECC decoding step S510 may be substantially the same as the product process of the parity check matrix and the soft read data during the second ECC decoding step S530.

When it is determined that the soft read data, on which the soft decision ECC decoding is performed, is corrected at step S535 (Y), it may be determined that the additional read operation according to soft read voltages $V_{SD}$ at step S531 is successful at step S520 and the operation of the memory controller 100 may end. The soft read data, on which the soft decision ECC decoding is performed at step S533, may be the error-corrected data and may be provided to the outside or used in the memory controller 100.

When it is determined that the soft read data, on which the soft decision ECC decoding is performed, is not corrected at step S535 (N), it may be determined that the read operation of the memory controller 100 on the memory cells MC0 to MCn−1 finally fails at step S540 and the operation of the memory controller 100 may end.

Figure 6A:
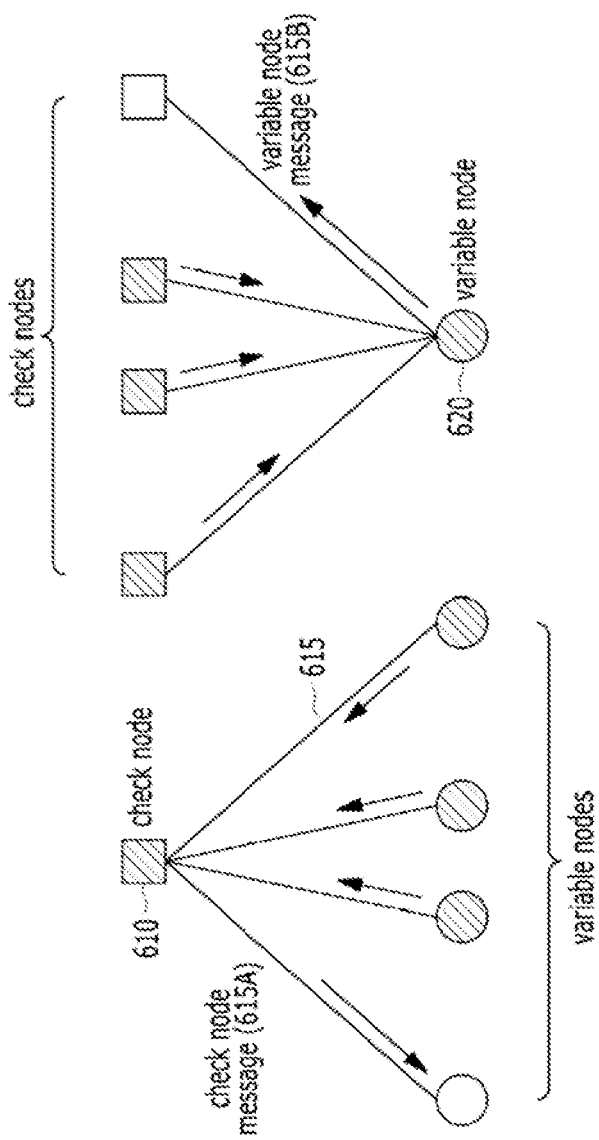
FIG. 6A is a schematic diagram illustrating LDPC decoding expressed by a tanner graph.

FIG. 6A is a schematic diagram illustrating LDPC decoding expressed by a tanner graph.

Figures 6B, 6C:
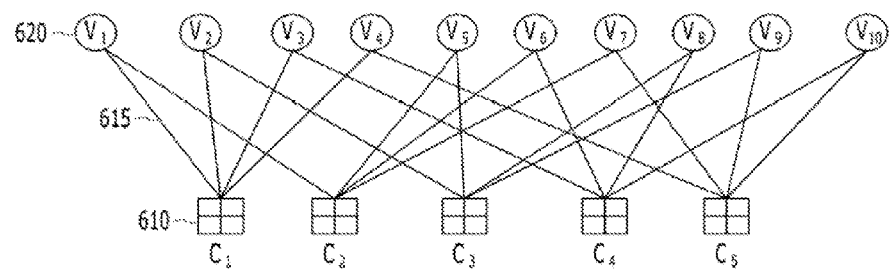
FIG. 6B is a schematic diagram illustrating an LDPC code.
FIG. 6C is a schematic diagram illustrating a syndrome check process according to LDPC decoding.

FIG. 6B is a schematic diagram illustrating an LDPC code.

FIG. 6C is a schematic diagram illustrating a syndrome check process according to the LDPC decoding.

An Error Correction Code (ECC) is commonly used in storage systems. Various physical phenomena occurring in storage devices result in noise effects that corrupt the stored information. Error correction coding schemes can be used for protecting the stored information against the resulting errors. This is done by encoding the information before storing the information in the memory device. The encoding process transforms the information bit sequence into a codeword by adding redundancy to the information. This redundancy can then be used to recover the information from the possibly corrupted codeword through a decoding process.

In iterative coding schemes, the code is constructed as a concatenation of several simple constituent codes and is decoded based on an iterative decoding algorithm by exchanging information between decoders receiving the simple constituent codes. Usually, the code can be defined using a bipartite graph or a tanner graph describing interconnections between the constituent codes. In this case, decoding can be viewed as an iterative message passing over the graph edges.

The iterative codes may include a low-density paritycheck (LDPC) code. The LDPC code is a linear binary block code defined by a sparse parity-check matrix H.

Referring to FIG. 6A, the LDPC code has a parity check matrix in which the number of 1s in each row and column is very small, and its structure can be defined by the tanner graph including check nodes 610, variable nodes 620, and edges 615 for connecting the check nodes 610 to the variable nodes 620. A value delivered from the check node 610 to the variable node 620 after check node processing becomes a check node message 615A, and a value delivered from the variable node 620 to the check node 610 after variable node processing becomes a variable node message 615B.

A decoding process of the LDPC code is performed by iterative decoding based on a 'sum-product' algorithm. A decoding method can be provided based on a suboptimal message-passing algorithm such as a 'min-sum' algorithm, which is a simplified version of the sum-product algorithm.

For example, referring to FIG. 6B, the tanner graph of the LDPC code includes 5 check nodes 610 representing parity check equations of the LDPC code, 10 variable nodes 620 representing code symbols, and edges 615 representing relationships between the check nodes 610 and the variable nodes 620. The edges 615 connect each check node 610 to the variable node 620 corresponding to a code symbol included in the parity check equations represented by the check nodes 610. FIG. 6B exemplarily illustrates a regular LDPC code in which the number of variable nodes 620 coupled to each of the check nodes 610 is fixed at 4 and the number of the check nodes 200 coupled to each of the variable nodes 620 is fixed at 2.

FIG. 6C shows a parity check matrix H corresponding to the tanner graph. The parity check matrix H is similar to the graphic expression of the parity check equations. In the parity check matrix H, the same number of 1s in each column and each row is included. That is, each column of the parity check matrix H has two 1s corresponding to the connections between each of the variable nodes 620 and the check nodes 610, and each row has four 1s corresponding to the connections between each of the check nodes 610 and the variable nodes 620.

A process of decoding the LDPC code is performed by iterating a process of exchanging messages, which are generated and updated in each node, between the variable nodes 620 and the check nodes 610 in the tanner graph. In this case, each node updates the messages based on the sum-product algorithm or a similar suboptimal algorithm.

The LDPC decoding on data having a predetermined length, which is read from the memory cell of the memory block 211 according to a first hard read voltage $V_{HD}$, may comprise a plurality of iterations, each of which includes an update of the check nodes 610 after an initial update of the variable nodes 620, an update of the variable nodes 620, and a syndrome check. After the single iteration, when the result of the syndrome check satisfies a predetermined condition, the LDPC decoding may end. When the result of the syndrome check does not satisfy the predetermined condition, another single iteration may be performed on the memory cell of the memory block 211 with a second hard read voltage $V_{HD}$ that is different from the first hard read voltage $V_{HD}$. The number of iterations may be limited to a maximum read count. When the result of the syndrome check does not satisfy the predetermined condition until the number of iterations reaches the maximum read count, the LDPC decoding on the data may be determined to have failed in ECC decoding.

Referring to FIG. 6C, the syndrome check is a process of identifying whether the product result $Hv^t$ of the parity check matrix H and a vector "v", which is obtained by the update of the variable nodes 620, satisfies the predetermined condition. When the product result $Hv^t$ of the parity check matrix H and the vector "v" becomes the zero vector, the product result $Hv^t$ may be evaluated to satisfy the predetermined condition.

FIG. 6C shows the syndrome check process. FIG. 6C exemplarily shows a non-zero vector "01000" as the product result $Hv^t$, and thus FIG. 6C shows that the syndrome check does not satisfy the predetermined condition and another single iteration should be performed with another hard read voltage $V_{HD}$.

Considering the non-zero vector "01000" as the product result $Hv^t$, the number of non-zero vector elements or elements, which do not meet the zero vector condition, is 1. In the description, the elements that do not meet the zero vector condition of the syndrome check for the product result Hv' in the single iteration is defined as unsatisfied syndrome check (USC). FIG. 6C shows the result of the syndrome check where the number of the USC is 1.

The number of USC may represent how many errors the hard read data has, that is, the number of errors included in the hard read data, and thus the number of USC may represent the degree of deterioration in the memory cells MC0 to MCn−1, or represent variance of the threshold voltage distribution of the memory cells MC0 to MCn−1. That is, the failure rate of the LDPC decoding and the number of USC may increase as the memory cells MC0 to MCn−1 deteriorate.

Figure 7A:
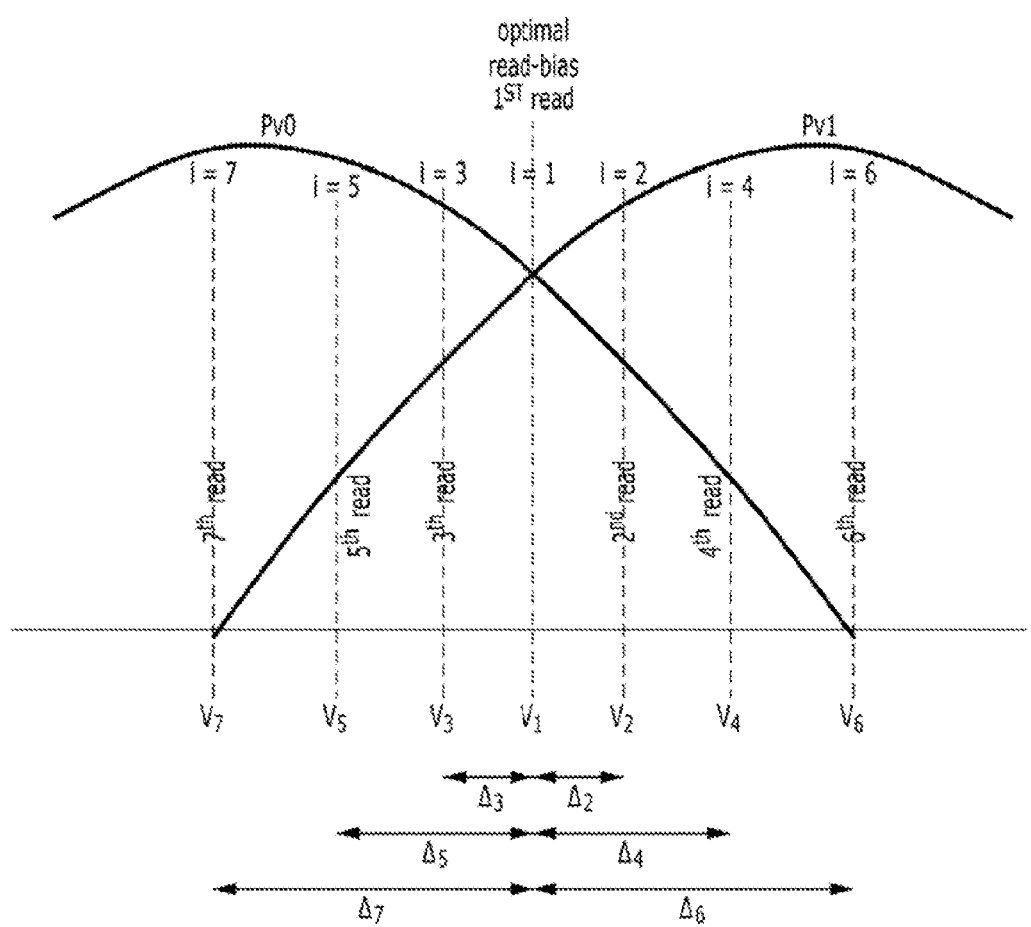
FIG. 7A is a schematic diagram illustrating a relationship between a hard read voltage and a soft read voltage.
Figure 7B:
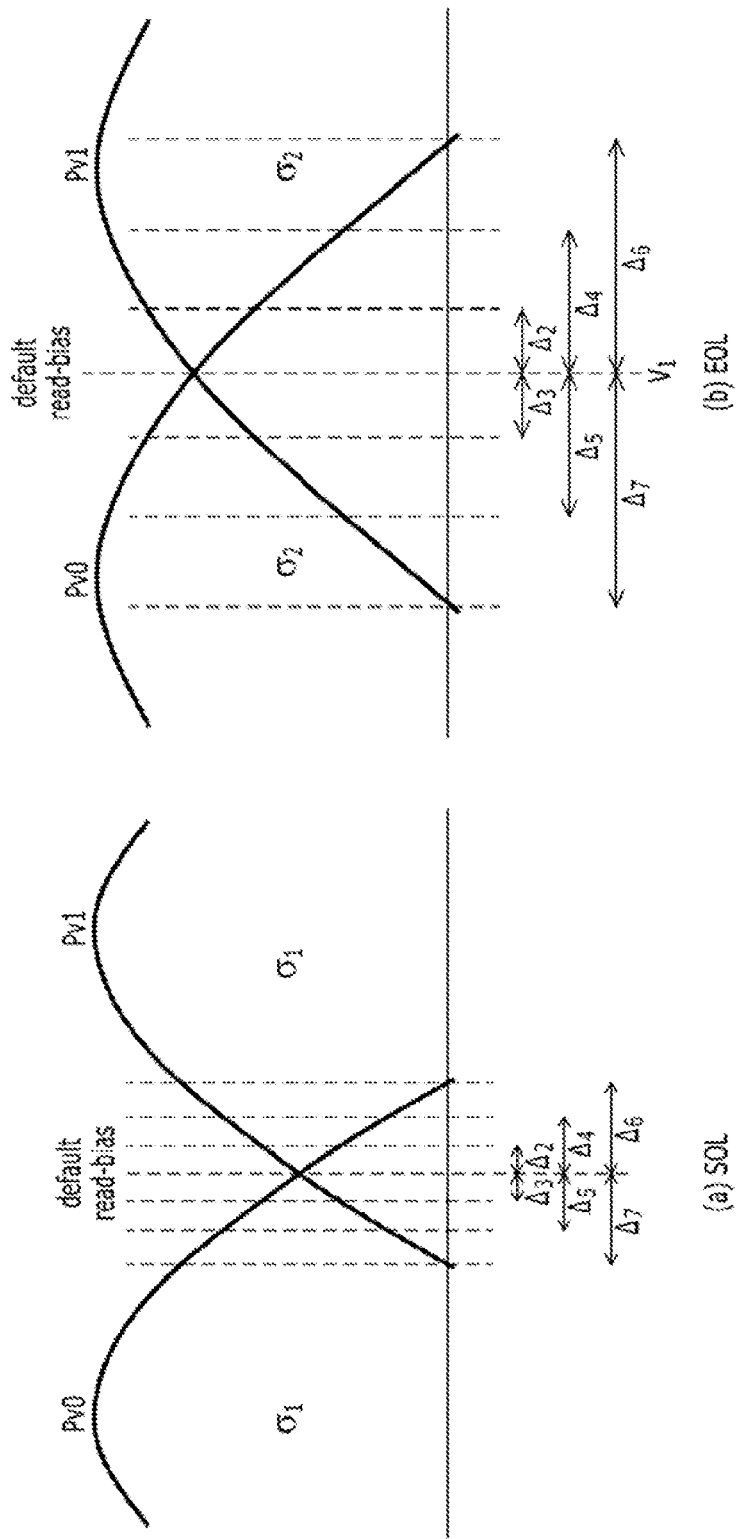
FIG. 7B is a schematic diagram illustrating changes in threshold voltages of a memory cell and changes in intervals between soft read voltages over time.

FIG. 7A is a schematic diagram illustrating a relationship between a hard read voltage and a soft read voltage, and FIG. 7B is a schematic diagram illustrating changes in threshold voltages of the memory cells MC0 to MCn−1 and changes in intervals between the soft read voltages $V_{SD}$ over time.

As described with reference to FIG. 5, the second ECC decoding step S530 may be a step of a soft decision ECC decoding on data by generating soft read data according to soft read voltages $V_{SD}$ corresponding to a predetermined hard read voltage $V_{HD}$ when the hard decision ECC decoding of the first ECC decoding step S510 finally fails.

The soft decision ECC decoding may be performed in response to a plurality of soft read voltages $V_{SD}$, each of which is spaced apart in voltage level from a predetermined hard read voltage $V_{HD}$ by a different quantization interval. For example, the low-density-parity-check (LDPC), which is one of the soft decision ECC decoding techniques applicable to NAND flash memory, works well by performing soft decision ECC decoding iteratively based on soft read data or a log likelihood ratio (LLR).

During the LDPC decoding, the LLR may be generated through the read operation on the memory cells MC0 to MCn−1 in response to the plurality of soft read voltages $V_{SD}$, each of which has a different quantization interval from the predetermined hard read voltage $V_{HD}$.

FIG. 7A shows a part (Pv0 and Pv1) of the threshold voltage distribution of one of the memory cells MC0 to MCn−1, and read voltages for reading data stored in the memory cells MC0 to MCn−1, and comprising a single hard read voltage $V_1$ and 6 soft read voltages $V_2$ to $V_7$, which respectively have the quantization intervals $\Delta_2$ to $\Delta_7$ from the predetermined hard read voltage $V_1$. Levels of the 6 soft read voltages $V_2$ to $V_7$ may be determined by magnitudes of the quantization intervals $\Delta_2$ to $\Delta_7$, respectively.

For the success of the second ECC decoding step S530, the quantization intervals $\Delta_2$ to $\Delta_7$ should be optimized. The optimization of the quantization intervals $\Delta_2$ to $\Delta_7$ may depend on the deterioration degree of the memory cells MC0 to MCn−1. That is, the optimization of the quantization intervals $\Delta_2$ to $\Delta_7$ may depend on the threshold voltage distribution of the memory cells MC0 to MCn−1, i.e., the variance of the threshold voltage distribution Pv0 and Pv1 shown in FIG. 7A. The optimization of the quantization intervals has been published in the paper [J. Wang, T. Courtade, H. Shankar, and R. Wesel, "Soft Information for LDPC decoding in flash: Mutual-information optimized quantization," in Proc. IEEE Global Commum. Conf. (GLOBECOM), 2011, pp. 5-9.]

FIG. 7B shows that the optimization of the quantization intervals $\Delta_2$ to $\Delta_7$ depend on the threshold voltage distribution of the memory cells MC0 to MCn−1, i.e., the variance of the threshold voltage distribution Pv0 and Pv1 shown in FIG. 7A.

For example, the variance $\sigma_1$ of the threshold voltage distribution Pv0 and Pv1 at the "Start of Life (SOL)" of the NAND flash memory device is generally smaller than the variance $\sigma_2$ of the threshold voltage distribution Pv0 and Pv1 at the "End of Life (EOL)" of the NAND flash memory device. Therefore, the optimized quantization intervals $\Delta_2$ to $\Delta_7$ at the EOL should be greater than the optimized quantization intervals $\Delta_2$ to $\Delta_7$ at the SOL.

Therefore, for the success of the second ECC decoding step S530, the quantization intervals $\Delta_2$ to $\Delta_7$ should be optimized and the optimization of the quantization intervals $\Delta_2$ to $\Delta_7$ may be determined based on the variance of the threshold voltage distribution of the memory cells MC0 to MCn−1.

According to the prior art, the second ECC decoding step S530 is performed in response to the soft read voltages $V_{SD}$ having quantization intervals $\Delta_2$ to $\Delta_7$ which are fixed, since it is difficult to identify in real time the variance of the threshold voltage distribution of the memory cells MC0 to MCn−1. For example, according to the prior art, the second ECC decoding step S530 is performed according to a first group of quantization intervals $\Delta_2$ and $\Delta_3$ having a first amount (4 steps=80 mV), a second group of quantization intervals $\Delta_4$ and $\Delta_5$ having a second amount (8 steps=160 mV), and a third group of quantization intervals $\Delta_6$ and $\Delta_7$ having a third amount (16 steps=32 mV). In the second ECC decoding according to such fixed quantization intervals, it is difficult to reflect the time-varying variance of the threshold voltage distribution of the memory cells MC0 to MCn−1 which deteriorate as time goes on.

Therefore, for the success of the second ECC decoding step S530, what is required are the optimized quantization intervals $\Delta_2$ to $\Delta_7$ adequately reflecting the time-varying variance of the threshold voltage distribution of the memory cells MC0 to MCn−1, which are deteriorated as time goes on.

In accordance with an exemplary embodiment of the present invention, optimized quantization intervals may be realized by adjusting the quantization intervals based on the USC since the deterioration degree of the memory cells MC0 to MCn−1 may be represented by the USC obtained during the first ECC decoding step S510.

Figure 8A:
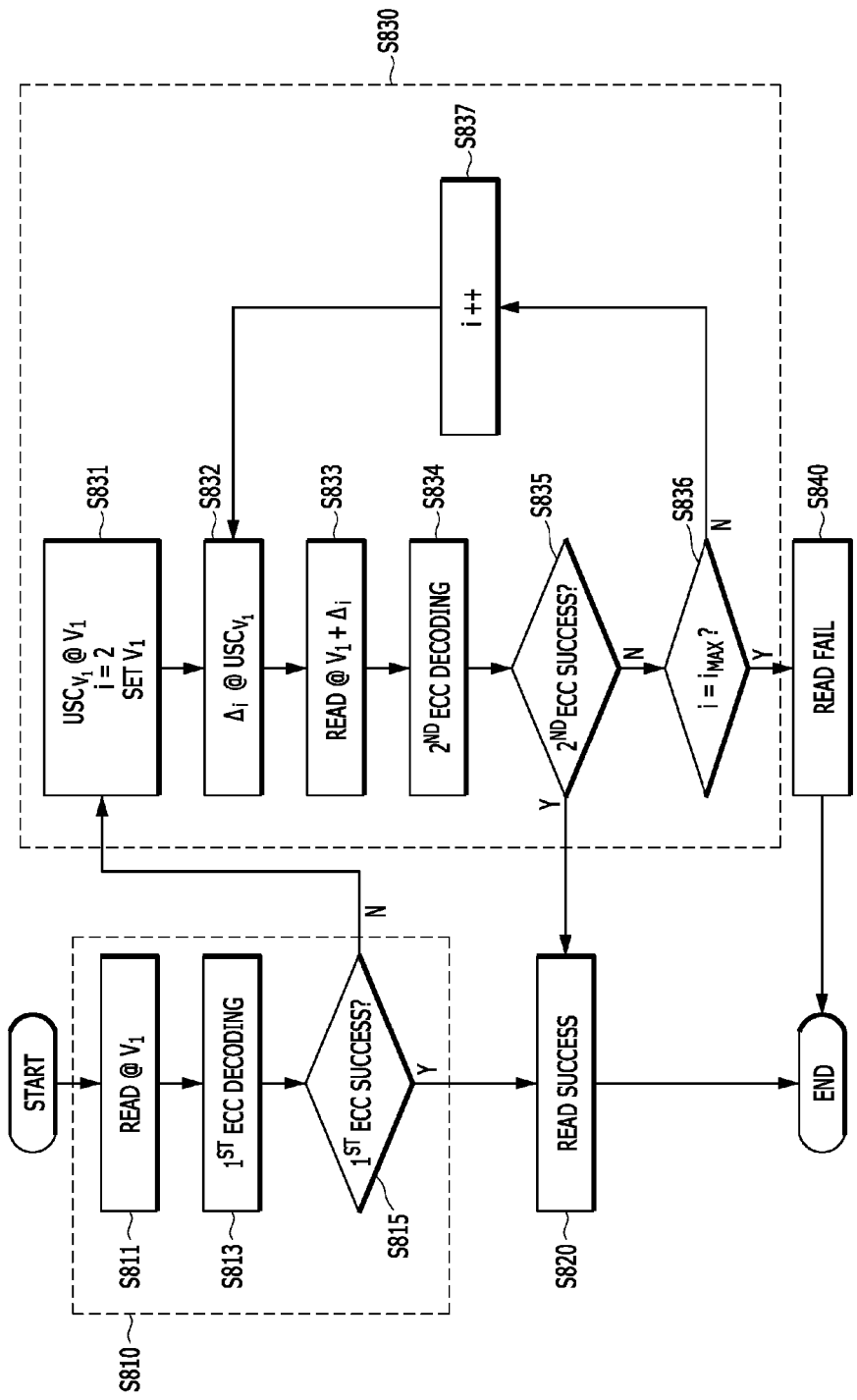
FIG. 8A is a flowchart illustrating an operation of a memory controller in accordance with an embodiment of the present invention.

FIG. 8A is a flowchart illustrating an operation of the memory controller 100 in accordance with an embodiment of the present invention.

FIG. 8A shows in detail the operation of the memory controller 100 described with reference to FIG. 5.

Referring to FIGS. 4A and 8A, the operation of the memory controller 100 may include a first ECC decoding step S810, and may additionally include a second ECC decoding step S830.

The first ECC decoding step S810 may include a hard decision ECC decoding on data of predetermined length, which is read from a memory cell of the memory block 211 according to hard read voltages $V_1$. The first ECC decoding step S810 may include steps S811 to S815.

The second ECC decoding step S830 may include a soft decision ECC decoding on the data by generating soft read data according to soft read voltages $V_{SD}$ corresponding to a predetermined hard read voltage ($V_1$ of FIG. 7A) when the hard decision ECC decoding of the first ECC decoding step S810 finally fails. The second ECC decoding step S830 may include steps S831 to S835.

At step S811, the data may be read from the semiconductor memory device 200 according to the hard read voltages $V_1$. The memory controller 100 may provide a read command and an address to the semiconductor memory device 200. The semiconductor memory device 200 may perform a read operation on the data therefrom corresponding to the hard read voltages $V_1$ in response to the read command and the address. The read data may be provided to the memory controller 100.

At step S813, the hard decision ECC decoding as the first ECC decoding may be performed. The ECC unit 130 may perform the hard decision ECC decoding on the hard read data, which is read from the semiconductor memory device 200 according to the hard read voltages $V_1$ at step S811, based on an error correction code.

At step S815, it may be determined whether the hard decision ECC decoding succeeds or fails. That is, at step S815, it may be determined whether an error of the hard read data, on which the hard decision ECC decoding is performed at step S813, is corrected. For example, the memory controller 100 may determine whether an error of the hard read data, on which the hard decision ECC decoding is performed at step S813, is corrected based on the hard read data and the parity check matrix. When a product result of the parity check matrix and the hard read data, on which the hard decision ECC decoding is performed at step S813, is the zero vector ('0') it may be determined that the hard read data, on which the hard decision ECC decoding is performed, is corrected. On the other hand, when the product result of the parity check matrix and the hard read data, on which the hard decision ECC decoding is performed, is not the zero vector ('0'), it may be determined that the hard read data, on which the hard decision ECC decoding is performed, is not corrected.

When it is determined that the hard read data, on which the hard decision ECC decoding is performed, is corrected at step S815 (Y), it may be determined that the read operation according to hard read voltages $V_1$ at step S811 is successful at step S820 and the operation of the memory controller 100 may end.

When it is determined that the hard read data, on which the hard decision ECC decoding is performed, is not corrected at step S815 (N), the second ECC decoding step S830 may be performed.

As described above with reference to FIGS. 6A to 6C, the number of USC may represent the deterioration degree of the memory cells MC0 to MCn−1, or represent the variance of the threshold voltage distribution of the memory cells MC0 to MCn−1. Therefore, in accordance with the exemplary embodiment of the present invention, the optimized quantization intervals, i.e., the quantization intervals $\Delta_2$ to $\Delta_7$ described with reference to FIGS. 7A and 7B, may be realized by adjusting the quantization intervals $\Delta_2$ to $\Delta_7$ based on the USC, and the soft read voltages $V_2$ to $V_7$ may be determined in response to the optimized quantization intervals $\Delta_2$ to $\Delta_7$. The optimized quantization intervals $\Delta_2$ to $\Delta_7$ may be obtained from a preset quantization interval table or real-time calculation.

At step S831, variables may be set for the second ECC decoding step S830. More specifically, the predetermined hard read voltage $V_1$ for the soft read voltages $V_2$ to $V_7$ may be determined. The number of USC $USC_{V1}$ corresponding to the hard read voltages $V_1$ which is used during the failed first ECC decoding step S810, may also be obtained. Further, an index value "i" for specifying the quantization intervals $\Delta_2$ to $\Delta_7$ and the soft read voltages $V_2$ to $V_7$ may be initialized to 2. The predetermined hard read voltage $V_1$ may be the hard read voltages $V_1$ used during the first ECC decoding step S810. The numbers of the quantization intervals $\Delta_2$ to $\Delta_7$ and the soft read voltages $V_2$ to $V_7$ may vary according to design.

At step S832, the memory controller 100 may calculate the optimized quantization interval $\Delta_i$ of the current index corresponding to the number of USC $USC_{V1}$. As described above, the optimized quantization interval $\Delta_i$ of the current index corresponding to the number of USC $USC_{V1}$ may be obtained from the preset quantization interval table or real-time calculation. For example, the optimized quantization interval $\Delta_i$ may be calculated according to the following Equation 1. For another example, the quantization interval table having the estimated number of USC $USC_{V1}$ as its index may be preset by pre-calculating the quantization intervals $\Delta_2$ to $\Delta_7$ based on the estimated number of USC $USC_{V1}$ according to the following Equation 1, and the optimized quantization interval $\Delta_i$ may be selected from the preset quantization interval table based on the number of USC $USC_{V1}$ corresponding to the hard read voltages $V_1$ used during the failed first ECC decoding step S810.

First pair of quantization intervals ($\Delta_2$ and $\Delta_3$)=9.48× $USC_{V1}$−0.846 [step]

Second pair of quantization intervals ($\Delta_4$ and $\Delta_5$)=31.45×$USC_{V1}$−2.74 [step]

Third pair of quantization intervals ($\Delta_6$ and $\Delta_7$)=53.9×$USC_{V1}$−4.038 [step] [Equation 1]

The coefficient values used in Equation 1 may be obtained through a heuristic approach or from the characteristics of the memory cells MC0 to MCn−1.

As an example, the quantization intervals $\Delta_2$ to $\Delta_7$ have the same values as the other one in each pair of the quantization intervals of Equation 1 when it is assumed that each threshold voltage distribution of the memory cells MC0 to MCn−1 is symmetrical based on the predetermined hard read voltage $V_1$ and thus each pair of the quantization intervals $\Delta_2$ to $\Delta_7$ is symmetrical based on the predetermined hard read voltage $V_1$. However, when each threshold voltage distribution of the memory cells MC0 to MCn−1 is asymmetrical based on the predetermined hard read voltage $V_1$, each pair of the quantization intervals $\Delta_2$ to $\Delta_7$ may not be symmetrical based on the predetermined hard read voltage $V_1$ and Equation 1 may be modified so that each of the quantization intervals $\Delta_2$ to $\Delta_7$ may have different values in each pair of quantization intervals.

Step S832 may be performed by the quantization interval generation unit 180 described above with reference to FIG. 4A.

At step S833, the data may be read from the semiconductor memory device 200 according to the soft read voltage $V_i$ which is determined by adding the predetermined hard read voltage $V_1$ determined at step S831 to the quantization interval $\Delta_i$ of the current index obtained at step S832. For example, an additional read operation according to the soft read voltages $V_i$ may be performed on the memory cell on which the first ECC decoding step S810 according to the hard read voltages $V_1$ is performed. The soft read voltages $V_i$ may have different levels from the hard read voltages $V_1$.

At step S833, the read bias control unit 170 described above with reference to FIG. 4A may determine the soft read voltage $V_i$ of the current index based on the predetermined hard read voltage $V_1$ and the quantization interval $\Delta_i$ of the current index.

At step S834, the soft decision ECC decoding as the second ECC decoding may be performed. The soft decision ECC decoding may be performed by the ECC unit 130 on the soft read data read from the semiconductor memory device 200 according to the soft read voltage $V_i$ of the current index.

At step S835, it may be determined whether the soft decision ECC decoding succeeds or fails. That is, at step S835, it may be determined whether an error of the soft read data, on which the soft decision ECC decoding is performed at step S834, is corrected. For example, the memory controller 100 may determine whether an error of the soft read data, on which the soft decision ECC decoding is performed at step S834, is corrected based on the soft read data and the parity check matrix. For example, when a product result of the parity check matrix and the soft read data, on which the soft decision ECC decoding is performed at step S834, is the zero vector ('0') it may be determined that the soft read data, on which the soft decision ECC decoding is performed, is corrected. On the other hand, when the product result of the parity check matrix and the soft read data, on which the soft decision ECC decoding is performed, is not the zero vector ('0'), it may be determined that the soft read data, on which the soft decision ECC decoding is performed, is not corrected.

When it is determined that the soft read data, on which the soft decision ECC decoding is performed, is corrected at step S835 (Y), it may be determined that the additional read operation according to the soft read voltage $V_i$ of the current index is successful at step S820 and the operation of the memory controller 100 may end.

When it is determined that the soft read data, on which the soft decision ECC decoding is performed, is not corrected at step S835 (N), the current index may be increased (i++) and steps S832 to S836 may be repeated until the value of the current index reaches a maximum value $i_{MAX}$, i.e., 7.

When it is determined that the soft read data, on which the soft decision ECC decoding is performed, is not corrected at step S835 (N) and the current index has the maximum value $i_{MAX}$, it may be determined that the read operation of the memory controller 100 on the memory cells MC0 to MCn−1 finally fails at step S840 and the operation of the memory controller 100 may end.

Figure 8B:
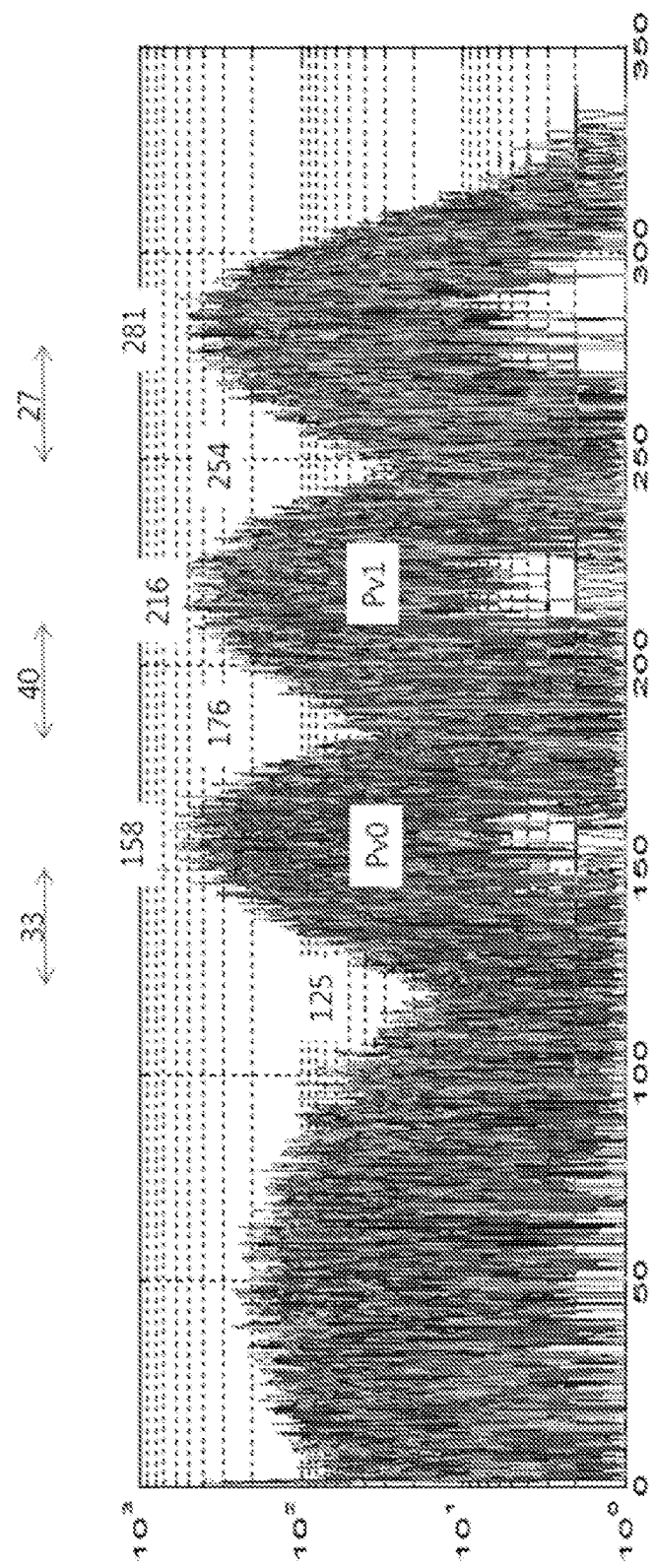
FIG. 8B is a graph illustrating a simulation for an operation of a memory system in accordance with an embodiment of the present invention.
Figure 8C:
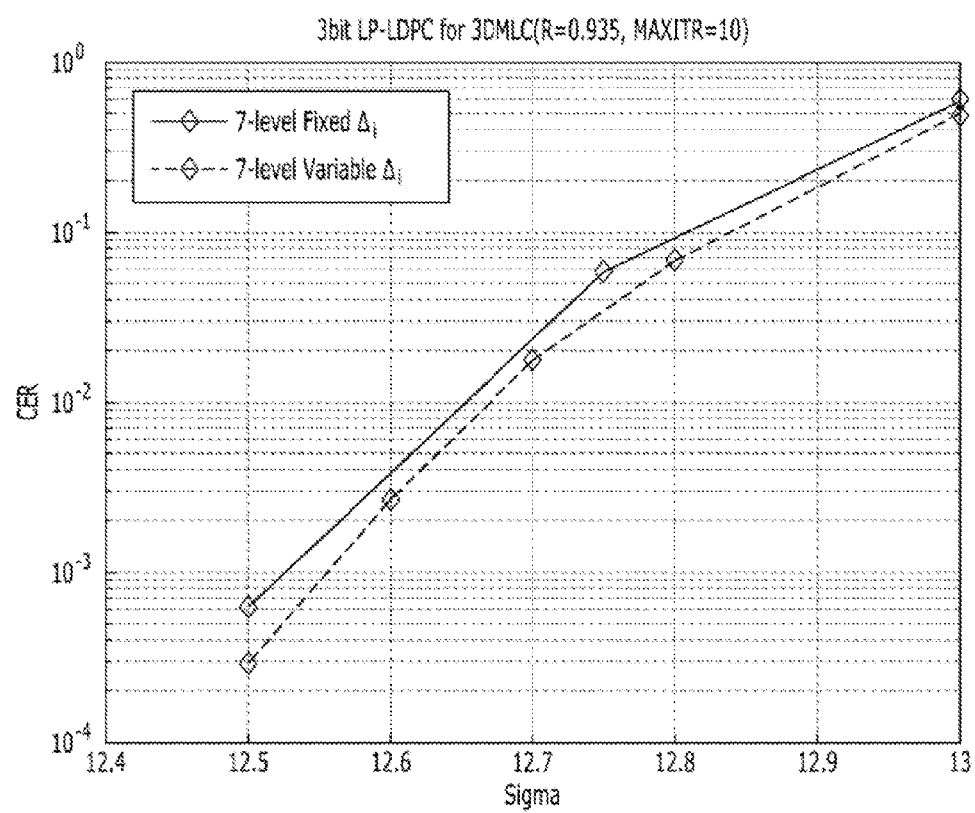
FIG. 8C is a graph illustrating a simulation result of an operation of a memory system in accordance with an embodiment of the present invention.

FIG. 8B is a graph illustrating a simulation circumstance for an operation of the memory system 10 in accordance with an embodiment of the present invention, and FIG. 8C is a graph illustrating a simulation result of the operation of the memory system 10 in accordance with an embodiment of the present invention.

FIGS. 8B and 8C show simulation results of the operation of the memory controller 100 in the memory system 10 described with reference to FIG. 8A.

Referring to FIGS. 8B and 8C, when a memory cell has the threshold voltage distribution Pv0 and Pv1 of a Gaussian distribution having the variances 12 and 13, and the 3-bit LDPC having code rate of 0.935 is applied to the memory cell, the chunk error rate (CER) when using the optimized quantization intervals ("7-level Variable $\Delta_i$") in accordance with the embodiment of the present invention is lower than the chunk error rate (CER) when using the fixed quantization intervals ("7-level Fixed $\Delta_i$") according to the prior art.

FIGS. 9 to 13 are diagrams schematically illustrating a three-dimensional (3D) nonvolatile memory device in accordance with an embodiment of the present invention. FIGS. 9 to 13 illustrate the semiconductor memory device, for example, a flash memory device, implemented in 3D in accordance with an embodiment of the present invention.

Figure 9:
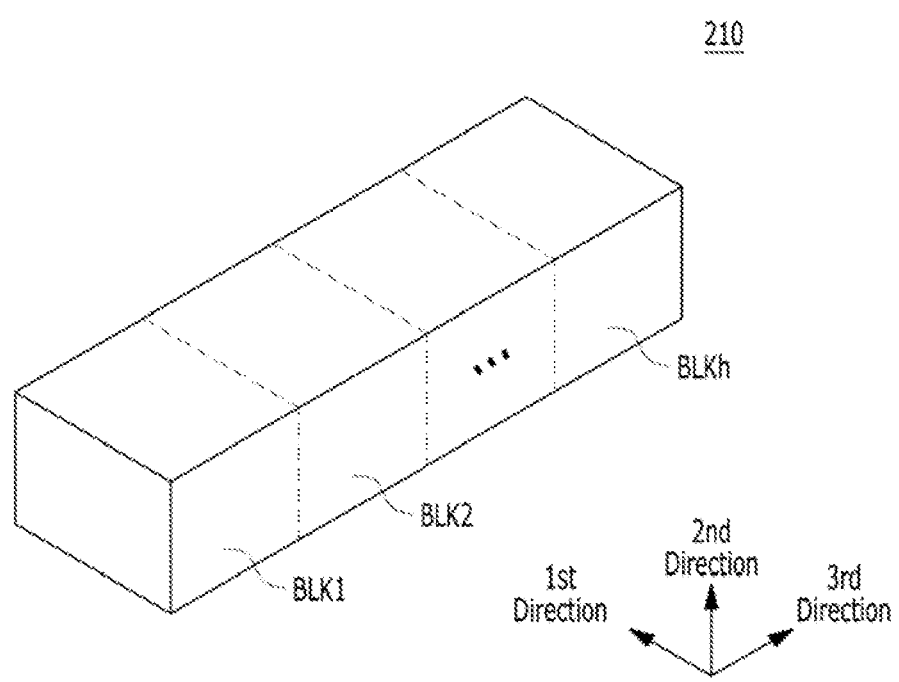
FIGS. 9 to 13 are diagrams schematically illustrating a three-dimensional (3D) nonvolatile memory device in accordance with an embodiment of the present invention.

FIG. 9 is a block diagram of the memory cell array 210 shown in FIG. 4B.

Referring to FIG. 9, the memory cell array 210 may include a plurality of memory blocks BLK1 to BLKh. Each of the memory blocks BLK1 to BLKh may have a 3D structure or a vertical structure. For example, each of the plural memory blocks BLK1 to BLKh may include a structure extending along first to third directions.

Each of the memory blocks BLK1 to BLKh may include a plurality of NAND strings NS extending along the second direction. A plurality of NAND strings NS may be provided along the first and third directions. Each of the NAND strings NS may be coupled to a bit line BL, one or more string select lines SSL, one or more ground select lines GSL, a plurality of word lines WL, one or more dummy word lines DWL, and a common source line CSL. That is, each of the memory blocks BLK1 to BLKh may be coupled to a plurality of bit lines BL, a plurality of string select lines SSL, a plurality of ground select lines GSL, a plurality of word lines WL, a plurality of dummy word lines DWL, and a plurality of common source lines CSL.

Figure 10:
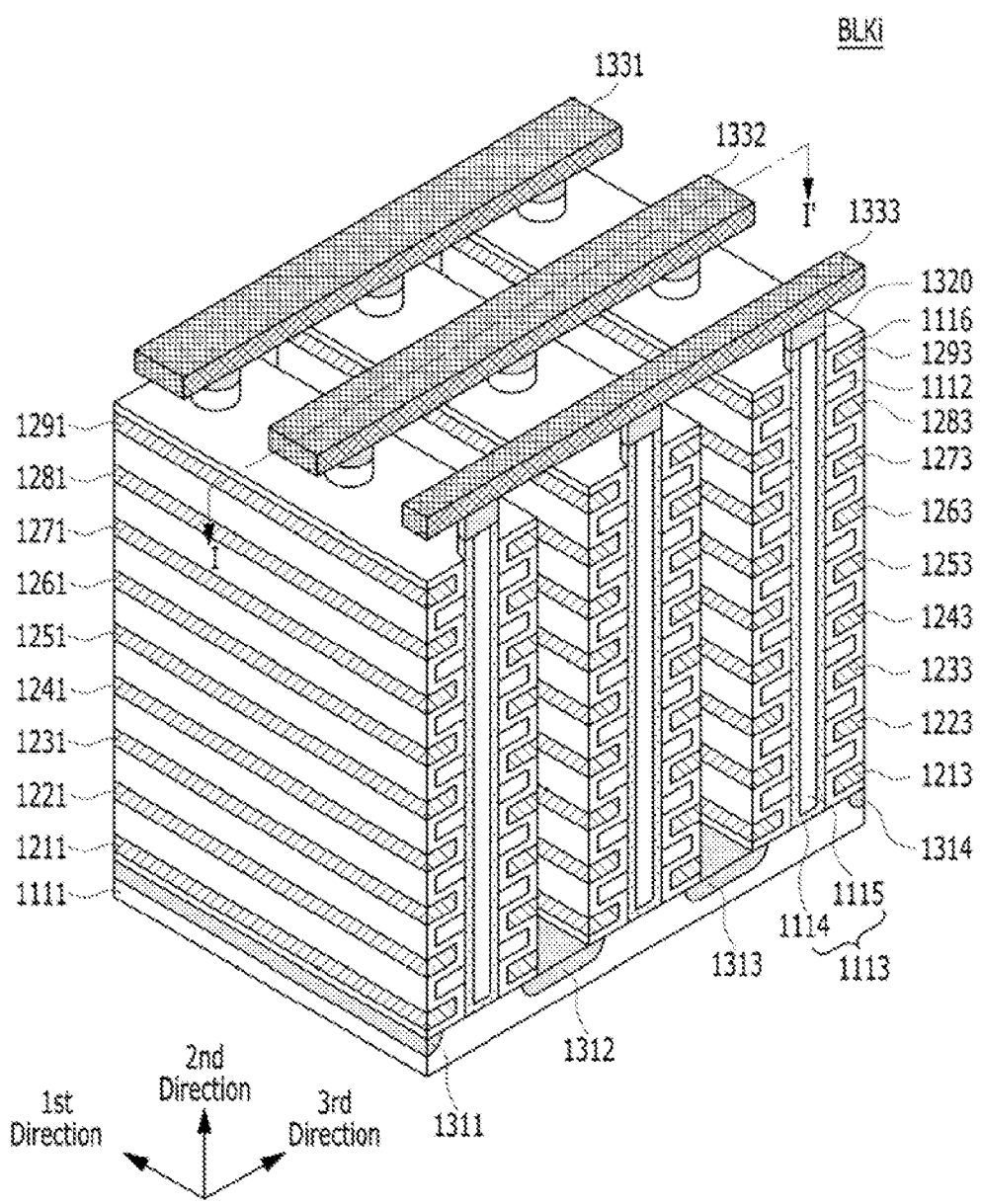
Figure 11:
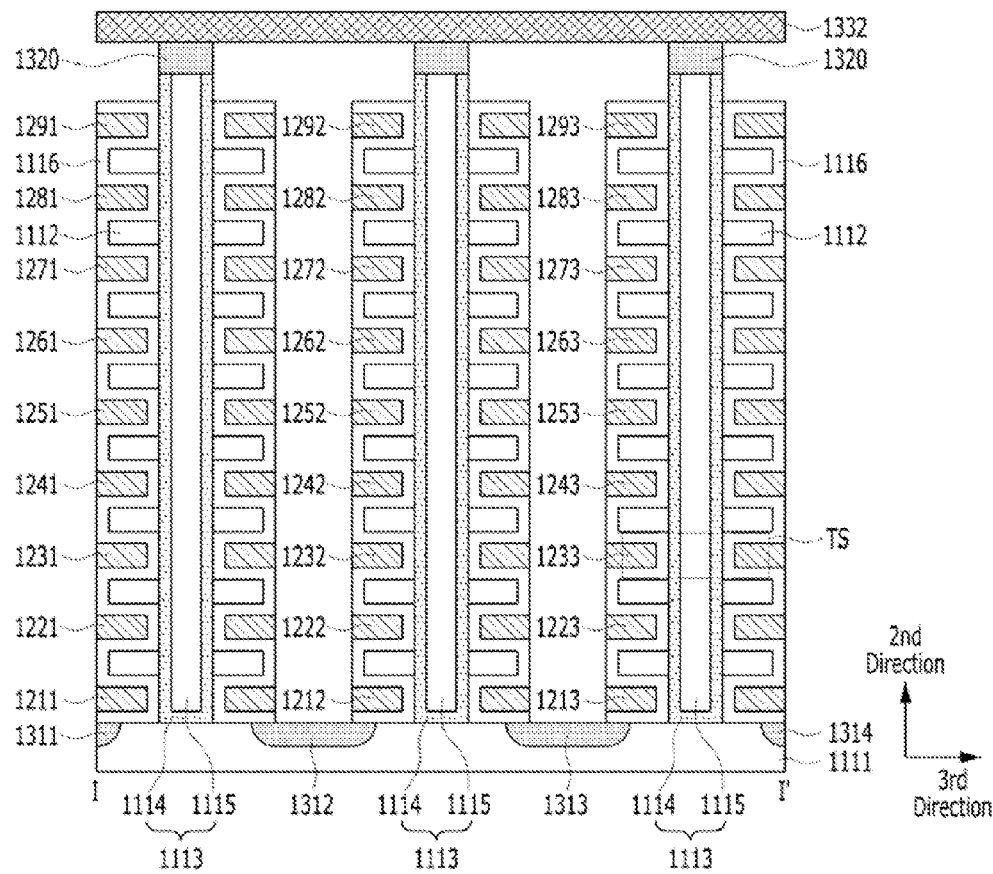

FIG. 10 is a perspective view of one memory block BLKi of the memory blocks BLK1 to BLKh shown in FIG. 9. FIG. 11 is a cross-sectional view taken along a line I-I' of the memory block BLKi shown in FIG. 10.

Referring to FIGS. 10 and 11, the memory block BLKi may include a structure extending along first to third directions.

A substrate 1111 may be provided. For example, the substrate 1111 may include a silicon material doped by a first type impurity. For example, the substrate 1111 may include a silicon material doped by a p-type impurity or a p-type well, e.g., a pocket p-well. The substrate 1111 may further include an n-type well surrounding the p-type well. In the description, it is exemplarily assumed that the substrate 1111 is p-type silicon. However, the substrate 1111 is not limited to p-type silicon.

A plurality of doping regions 1311 to 1314 extending along the first direction may be provided over the substrate 1111. For example, the plurality of doping regions 1311 to 1314 may have a second type impurity differing from that of the substrate 1111. For example, the plurality of doping regions 1311 to 1314 may be doped with an n-type impurity. In the description, it is exemplarily assumed that the first to fourth doping regions 1311 to 1314 are n-type. However, the first to fourth doping regions 1311 to 1314 are not limited to n-type.

A plurality of insulation materials 1112 extending along the first direction may be sequentially provided along the second direction over a region of the substrate 1111 between the first and second doping regions 1311 and 1312. For example, the insulation materials 1112 and the substrate 1111 may be spaced apart by a predetermined distance in the second direction. In a second example, the insulation materials 1112 may be spaced apart from each other in the second direction. In a third example, the insulation materials 1112 may include an insulator such as silicon oxide.

A plurality of pillars 1113 may be sequentially provided along the first direction over a region of the substrate 111 between the first doping region 1311 and the second doping region 1312, and may be formed to penetrate the insulation materials 1112 along the second direction. For example, each of the pillars 1113 may penetrate the insulation materials 1112 to contact the substrate 1111. For example, each of the pillars 1113 may be composed of a plurality of materials. A surface layer 1114 of each of the pillars 1113 may include a silicon material having a first type of impurity. The surface layer 1114 of each of the pillars 1113 may include a silicon material doped with the same type impurity as that of the substrate 1111. In the description, it is exemplarily assumed that the surface layer 1114 of each of the pillars 1113 includes p-type silicon. However, the surface layer 1114 of each of pillars 1113 is not limited to being p-type silicon.

An inner layer 1115 of each of the pillars 1113 may be formed of an insulation material. For example, the inner layer 1115 of each of the pillars 1113 may be filled with an insulation material such as silicon oxide.

In a region between the first and second doping regions 1311 and 1312, an insulation layer 1116 may be provided along exposed surfaces of the insulation materials 1112, the pillars 1113, and the substrate 1111. For example, the thickness of the insulation layer 1116 may be less than half of the distance between the insulation materials 1112. That is, a region in which a material other than the insulation materials 1112 and the insulation layer 1116 is disposed may be provided between (i) the insulation layer 1116 provided over the bottom surface of a first insulation material of the insulation materials 1112 and (ii) the insulation layer 1116 provided over the top surface of a second insulation material of the insulation materials 1112. The first insulation material of the insulation materials 1112 may be disposed over the second insulation material of the insulation materials 1112.

In the region between the first and second doping regions 1311 and 1312, conductive materials 1211 to 1291 may be provided over the surface of the insulation layer 1116. For example, the conductive material 1211 extending along the first direction may be provided between the substrate 1111 and the insulation materials 1112 adjacent to the substrate 1111. More specifically, the conductive material 1211 extending along the first direction may be provided between (i) the insulation layer 1116 disposed at the bottom surface of the insulation materials 1112 adjacent to the substrate 1111 and (ii) the insulation layer 1116 disposed over the substrate 1111.

A conductive material extending along the first direction may be provided between (i) the insulation layer 1116 disposed at the top surface of a first specific insulation material among the insulation materials 1112 and (ii) the insulation layer 1116 disposed at the bottom surface of a second specific insulation material among the insulation materials 1112, which is disposed over the first specific insulation material 1112. For example, a plurality of conductive materials 1221 to 1281 extending along the first direction may be provided between the insulation materials 1112. Also, a conductive material 1291 extending along the first direction may be provided over the uppermost insulation materials 1112. For example, the conductive materials 1211 to 1291 extending along the first direction may be a metallic material. In another example, the conductive materials 1211 to 1291 extending along the first direction may be a conductive material such as polysilicon.

The same structure as the structure disposed between the first and second doping regions 1311 and 1312 may be provided between the second and third doping regions 1312 and 1313. For example, the insulation materials 1112 extending along the first direction, the pillars 1113 which are sequentially arranged in the first direction and penetrate the insulation materials 1112 along the second direction, the insulation layer 1116 provided over the surfaces of the insulation materials 1112 and the pillars 1113, and the conductive materials 1212 to 1292 extending along the first direction may be provided between the second and third doping regions 1312 and 1313.

The same structure as disposed between the first and second doping regions 1311 and 1312 may be provided between the third and fourth doping regions 1313 and 1314. For example, the insulation materials 1112 extending along the first direction, the pillars 1113 which are sequentially arranged in the first direction and penetrate the insulation materials 1112 along the second direction, the insulation layer 1116 provided over the surfaces of the insulation materials 1112 and the pillars 1113, and the conductive materials 1213 to 1293 extending along the first direction may be provided between the third and fourth doping regions 1313 and 1314.

Drains 1320 may be provided over the pillars 1113, respectively. For example, the drains 1320 may be a silicon material doped with a second type material. For example, the drains 1320 may be a silicon material doped with an n-type material. In the description, it is exemplarily assumed that the drains 320 are a silicon material doped with an n-type material. However, the drains 320 are not limited to being n-type silicon materials. For example, the width of the drains 1320 may be wider than that of its corresponding one of the plural pillars 1113. For example, the drains 1320 may be provided over a top surface of its corresponding one of the plural pillars 1113, in a pad shape.

Conductive materials 1331 to 1333 extending in the third direction may be provided over the drains 1320. The conductive materials 1331 to 1333 may be sequentially disposed along the first direction. The conductive materials 1331 to 1333 may be respectively coupled to the drains 1320 in the corresponding region. For example, the drains 1320 and the conductive material 1333 extending along the third direction may be coupled to each other through contact plugs, respectively. For example, the conductive materials 1331 to 1333 extending along the third direction may be a metallic material. In another example, the conductive materials 1331 to 1333 may be a conductive material such as polysilicon.

Referring to FIGS. 10 and 11, each of the pillars 1113 may be coupled to the insulation layer 1116 and the plurality of conductive materials 1211 to 1291, 1212 to 1292, and 1213 to 1293 extending along the first direction, to form a string. For example, each of the pillars 1113 may form a NAND string NS together with the insulation layer 1116 and the conductive materials 1211 to 1291, 1212 to 1292, and 1213 to 1293 extending along the first direction. The NAND string NS may include a plurality of transistor structures TS.

Figure 12:
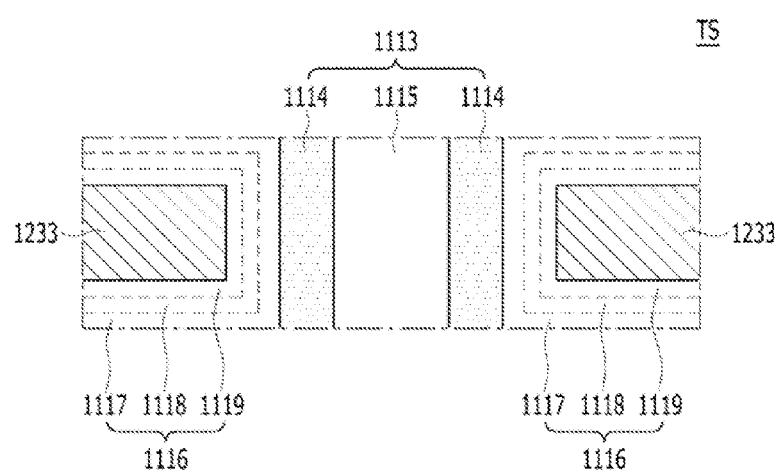

FIG. 12 is a cross-sectional view of the transistor structure TS shown in FIG. 11.

Referring to FIGS. 10 to 12, the insulation layer 1116 may include first to third sub insulation layers 1117, 1118 and 1119.

The surface layer 1114 of P-type silicon in each of the pillars 1113 may serve as a body. The first sub insulation layer 1117, adjacent to each of the plural pillars 1113, may serve as a tunnelling insulation layer. For example, the first sub insulation layer 1117, adjacent to the each of the pillars 1113, may include a thermal oxide layer.

The second sub insulation layer 1118 may serve as a charge storage layer. For example, the second sub insulation layer 1118 may serve as a charge trap layer. The second sub insulation layer 1118 may include a nitride layer or a metal oxide layer, e.g., aluminium oxide layer, hafnium oxide layer, etc.

The third sub insulation layer 1119, adjacent to a conductive material 1233, may serve as a blocking insulation layer. For example, the third sub insulation layer 1119, adjacent to the conductive material 1233 extending along the first direction, may have a mono-layered or multi-layered structure. The third sub insulation layer 1119 may be a high dielectric layer, e.g., aluminium oxide layer, hafnium oxide layer, etc., having a dielectric constant greater than the first and second sub insulation layers 1117 and 1118.

The conductive material 1233 may serve as a gate or control gate. That is, the gate or control gate 1233, the blocking insulation layer 1119, the charge trap layer 1118, the tunnelling insulation layer 1117, and the body 1114 may form a transistor or memory cell transistor structure. For example, the first to third sub insulation layers 1117 to 1119 may form an oxide-nitride-oxide (ONO) structure. In the description, the surface layer 1114 of p-type silicon in each of the plural pillars 1113 may be a body extending in the second direction.

The memory block BLKi may include the plurality of pillars 1113. That is, the memory block BLKi may include the plurality of NAND strings NS. More specifically, the memory block BLKi may include the plurality of NAND strings NS extending along the second direction or a direction perpendicular to the substrate 1111.

Each of the NAND strings NS may include the plurality of transistor structures TS, which are stacked in the second direction. One or more of the plurality of transistor structures TS of each NAND string NS may serve as a string select transistor SST. One or more of the plurality of transistor structures TS of each NAND string may serve as a ground select transistor GST.

The gates or control gates may correspond to the conductive materials 1211 to 1291, 1212 to 1292, and 1213 to 1293 extending along the first direction. That is, the gates or control gates may extend along the first direction to form word lines WL and two or more select lines, e.g., one or more string select lines SSL and one or more ground select lines GSL.

The conductive materials 1331 to 1333 extending along the third direction may be coupled to one end of the NAND strings NS. For example, the conductive materials 1331 to 1333 extending along the third direction may serve as bit lines BL. That is, in one memory block BLKi, a single bit line BL may be coupled to the plurality of NAND strings.

The second type doping regions 1311 to 1314 extending along the first direction may be coupled to the other end of the NAND strings NS. The second type doping regions 1311 to 1314 extending along the first direction may serve as common source lines CSL.

In summary, the memory block BLKi may include the plurality of NAND strings NS extending along a direction, e.g., a second direction, perpendicular to the substrate 1111, and may operate as a NAND flash memory block, for example, a charge trap type memory, in which the plurality of NAND strings NS is coupled to a single bit line BL.

With reference to FIGS. 10 to 12, the conductive materials 1211 to 1291, 1212 to 1292, and 1213 to 1293 extending along the first direction are provided on 9 layers. However, the first conductive materials 1211 to 1291, 1212 to 1292, and 1213 to 1293 extending along the first direction are not limited to 9 layers. For example, the conductive materials extending along the first direction may be provided upon 8, 16, or more layers. That is, a NAND string may include 8, 16, or more transistors.

With reference to FIGS. 10 to 12, three (3) NAND strings NS are coupled to a single bit line BL. However, the embodiment is not limited to 3 NAND strings NS coupled to a single bit line BL. In another embodiment, in the memory block BLKi, m NAND strings NS may be coupled to a single bit line BL, m being an integer. Here, the number of the conductive materials 1211 to 1291, 1212 to 1292, and 1213 to 1293 extending along the first direction and the number of common source lines 1311 to 1314 may also be adjusted to correspond to the number of NAND strings NS coupled to a single bit line BL.

With reference to FIGS. 10 to 12, three (3) NAND strings NS are coupled to a single conductive material extending along the first direction. However, the embodiment is not limited to 3 NAND strings NS coupled to a single conductive material. In another embodiment, n NAND strings NS may be coupled to a single conductive material, n being an integer. Here, the number of the conductive materials 1331 to 1333 extending along the third direction may also be adjusted to correspond to the number of NAND strings NS coupled to a single conductive material.

Figure 13:
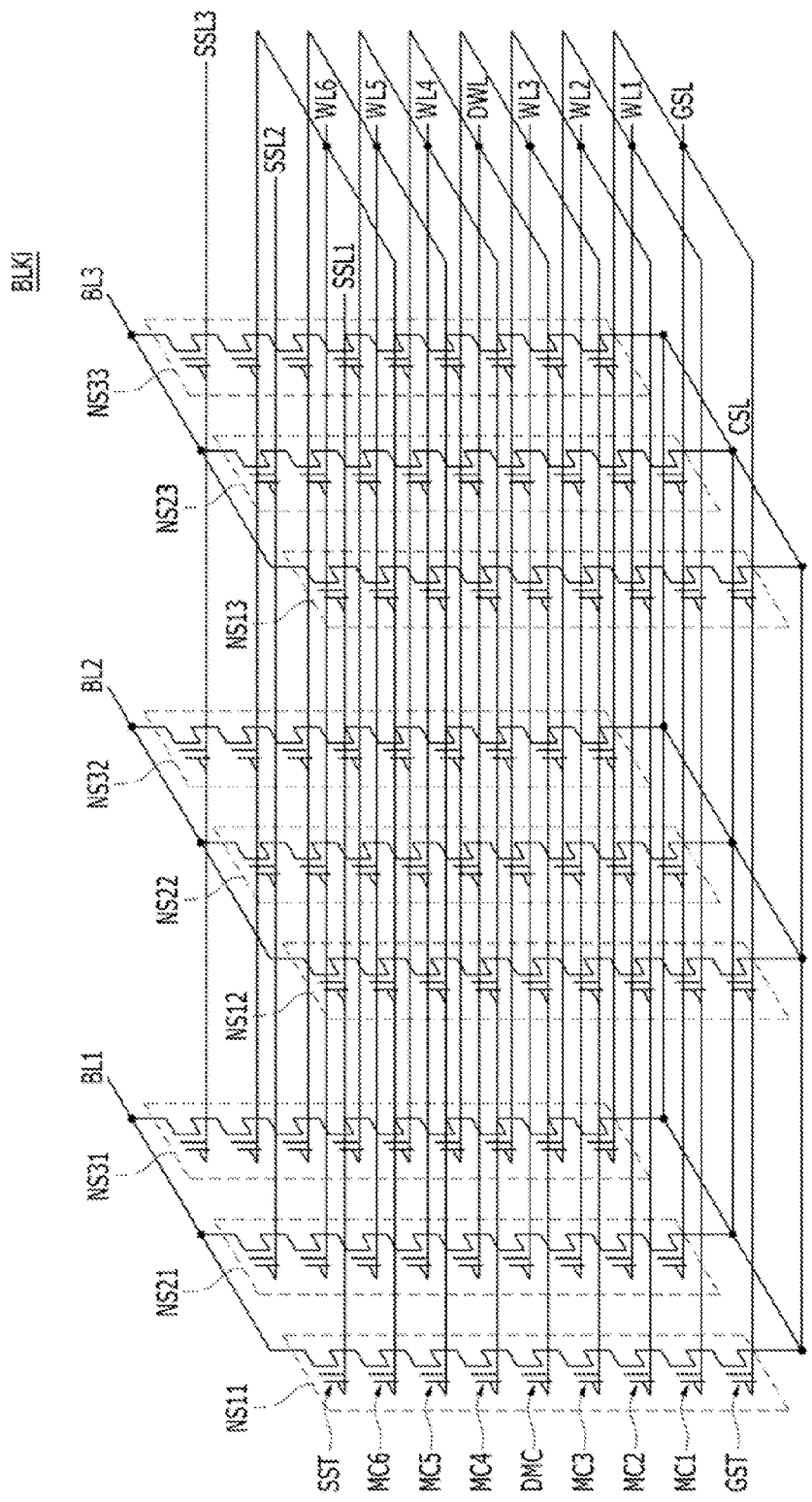

FIG. 13 is an equivalent circuit diagram illustrating the memory block BLKi described with reference to FIGS. 10 to 12.

Referring to FIGS. 10 to 13, NAND strings NS11 to NS31 may be provided between a first bit line BL1 and a common source line CSL. The first bit line BL1 may correspond to the conductive material 1331 extending along the third direction. NAND strings NS12 to NS32 may be provided between a second bit line BL2 and the common source line CSL. The second bit line BL2 may correspond to the conductive material 1332 extending along the third direction. NAND strings NS13 to NS33 may be provided between a third bit line BL3 and the common source line CSL. The third bit line BL3 may correspond to the conductive material 1333 extending along the third direction.

A string select transistor SST of each NAND string NS may be coupled to a corresponding bit line BL. A ground select transistor GST of each NAND string NS may be coupled to the common source line CSL. Memory cells MC may be provided between the string select transistor SST and the ground select transistor GST of each NAND string NS.

The NAND strings NS may be defined in units of rows and columns. The NAND strings NS commonly coupled to a single bit line may form a single column. For example, the NAND strings NS11 to NS31 coupled to the first bit line BL1 may correspond to a first column. The NAND strings NS12 to NS32 coupled to the second bit line BL2 may correspond to a second column. The NAND strings NS13 to NS33 coupled to the third bit line BL3 may correspond to a third column.

The NAND strings NS coupled to a single string select line SSL may form a single row. For example, the NAND strings NS11 to NS13 coupled to a first string select line SSL1 may form a first row. The NAND strings NS21 to NS23 coupled to a second string select line SSL2 may form a second row. The NAND strings NS31 to NS33 coupled to a third string select line SSL3 may form a third row.

A height may be defined for each NAND string NS. For example, the height of the ground select transistor GST may be defined as a value '1' in each NAND string NS. In each NAND string NS, the closer to the string selection transistor SST, the higher the height of the memory cell when measured from the substrate 1111. In each NAND string NS, the height of the memory cell MC6 adjacent to the string select transistor SST may be defined as a value '8', which is 8 times greater than the ground select transistor GST.

The string select transistors SST of the NAND strings NS of the same row may share the same string select line SSL. The string select transistors SST of the NAND strings NS in different rows may be coupled with different string select lines SSL1, SSL2, and SSL3, respectively.

The memory cells MC having the same height in the NAND strings NS of the same row may share a word line WL. At a predetermined height, the word line WL may be shared by the memory cells MC of the NAND strings NS in different rows but in the same level or at the same height. At a predetermined height or at the same level, dummy memory cells DMC of the NAND strings NS of the same row may share a dummy word line DWL. At a predetermined height or level, the dummy memory cells DMC of the NAND strings NS in different rows may share the dummy word lines DWL.

For example, the word lines WL or the dummy word lines DWL located at the same level or height or layer may be commonly coupled on layers where the conductive materials 1211 to 1291, 1212 to 1292, and 1213 to 1293 extending in the first direction are provided. For example, the conductive materials 1211 to 1291, 1212 to 1292, and 1213 to 1293 provided at a given level or height or layer may be coupled to an upper layer via a contact. The conductive materials 1211 to 1291, 1212 to 1292, and 1213 to 1293 extending in the first direction may be coupled in common at the upper layer. The ground select transistors GST of the NAND strings NS of the same row may share the ground select line GSL. The ground select transistors GST of the NAND strings NS in different rows may share the ground select line GSL. That is, the NAND strings NS11 to NS13, NS21 to NS23, and NS31 to NS33 may be coupled in common to the ground select line GSL.

The common source line CSL may be coupled to the NAND strings NS. For example, the first to fourth doping regions 1311 to 1314 may be coupled at an active region of the substrate 1111. For example, the first to fourth doping regions 1311 to 1314 may be coupled to an upper layer via a contact. The first to fourth doping regions 1311 to 1314 may be coupled in common at the upper layer.

As illustrated in FIG. 13, the word lines WL at the same height or level may be commonly coupled. Therefore, when a word line WL at a specific height is selected, all of the NAND strings NS coupled to the selected word line WL may be selected. The NAND strings NS in different rows may be coupled to different string select lines SSL. Accordingly, among the NAND strings NS coupled to the same word line WL, the NAND strings NS of the unselected row may be electrically isolated from the bit lines BL1 to BL3 according to selection of the string selection lines SSL1 to SSL3. That is, a row of the NAND strings NS may be selected by selecting one of the string select lines SSL1 to SSL3. The NAND strings NS of the selected row may be selected in units of columns according to selection of the bit lines BL1 to BL3.

In each NAND string NS, a dummy memory cell DMC may be provided. FIG. 13 shows the dummy memory cell DMC provided between the third memory cell MC3 and the fourth memory cell MC4 in each NAND string NS. That is, the first to third memory cells MC1 to MC3 may be provided between the dummy memory cell DMC and the ground select transistor GST. The fourth to sixth memory cells MC4 to MC6 may be provided between the dummy memory cell DMC and the string select transistor SST. In the embodiment, it is exemplarily assumed that the memory cells MC in each NAND string NS are divided into memory cell groups by the dummy memory cell DMC. A memory cell group, e.g., MC1 to MC3, that is adjacent to the ground select transistor GST among the memory cell groups may be referred to as a lower memory cell group. A memory cell group, e.g., MC4 to MC6, adjacent to the string select transistor SST among the memory cell groups may be referred to as an upper memory cell group.

An operating method of a nonvolatile memory device that includes one or more cell strings arranged in a direction perpendicular to a substrate and coupled with a memory controller, a string select transistor, and a ground select transistor will be described with reference to FIGS. 9 to 13. With the operating method, the nonvolatile memory device may: be provided with a first read command to perform a first hard decision read operation according to a first hard read voltage; acquire hard read data; acquire soft read data according to a soft read voltage, which is different from the first hard decision read voltage; and provide the soft read data to a memory controller.

Figure 14:
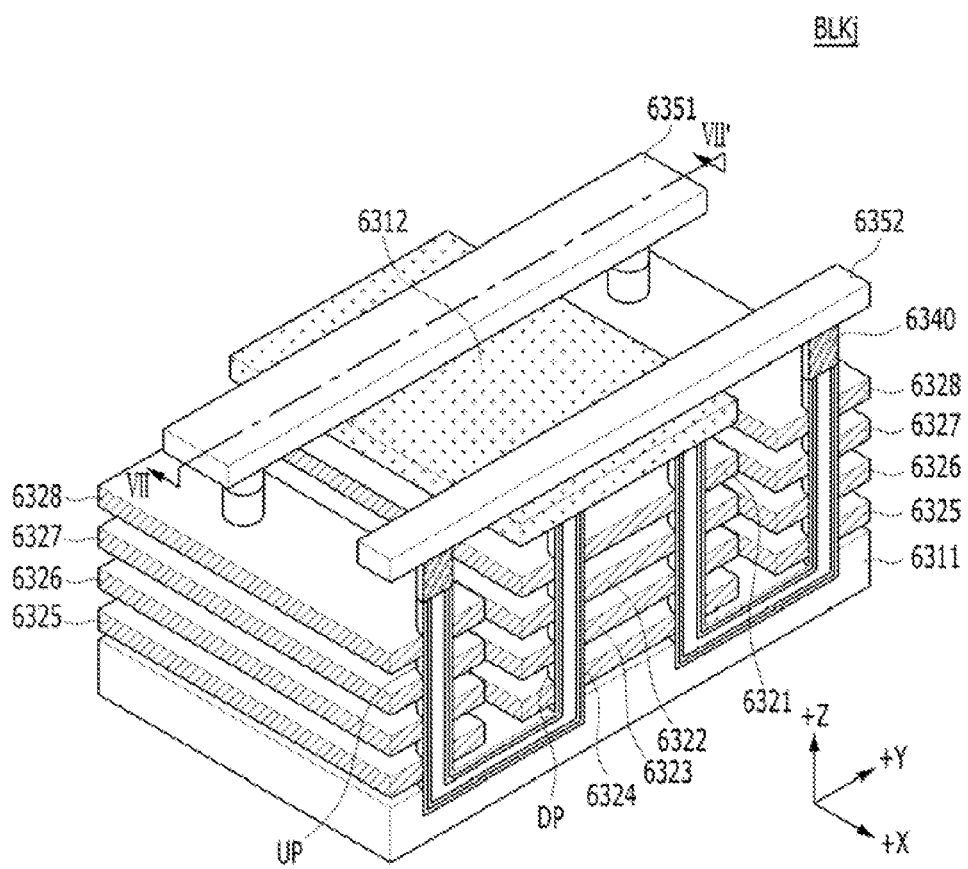
FIGS. 14 to 16 are diagrams schematically illustrating a 3D nonvolatile memory device in accordance with an embodiment of the present invention.
Figure 15:
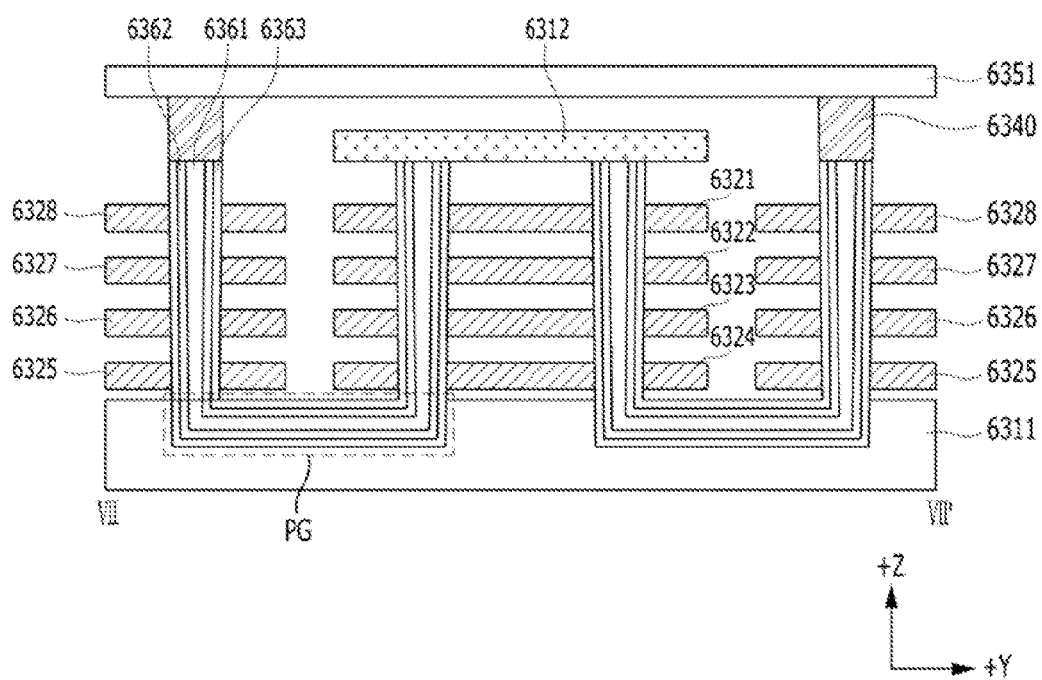
Figure 16:
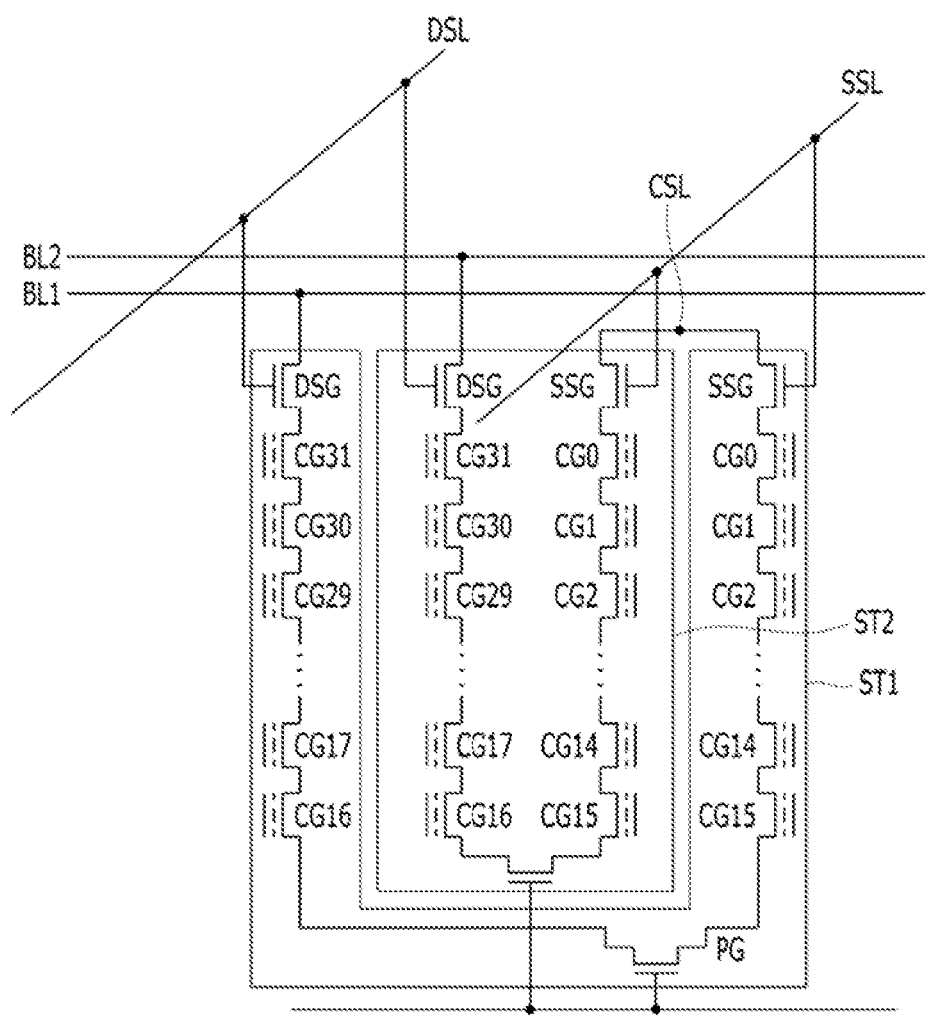

FIGS. 14 to 16 are diagrams schematically illustrating a 3D nonvolatile memory device in accordance with an embodiment of the present invention. FIGS. 14 to 16 illustrate the semiconductor memory device, for example, a flash memory device implemented in 3D in accordance with an embodiment of the present invention.

FIG. 14 is a perspective view illustrating one memory block BLKj of the memory blocks 211 shown in FIG. 4A. FIG. 15 is a sectional view illustrating the memory block BLKj taken along the line VII-VII' shown in FIG. 14.

Referring to FIGS. 14 and 15, the memory block BLKj may include a structure extending along first to third directions.

A substrate 6311 may be provided. For example, the substrate 6311 may include a silicon material doped by a first type impurity. For example, the substrate 6311 may include a silicon material doped by a p-type impurity or a p-type well, e.g., a pocket p-well. The substrate 6311 may further include an n-type well surrounding the p-type well. In the embodiment, it is exemplarily assumed that the substrate 6311 is p-type silicon. However, the substrate 6311 will not be limited to the p-type silicon.

First to a fourth conductive material layers 6321 to 6324 extending along the X-direction and the Y-direction may be disposed over the substrate 6311. The first to fourth conductive material layers 6321 to 6324 may be spaced from one another in the Z-direction.

Fifth to eighth conductive material layers 6325 to 6328 extending along the X-direction and the Y-direction may be disposed over the substrate 6311. The fifth to eighth conductive material layers 6325 to 6328 may be spaced from one another in the Z-direction. The fifth to eighth conductive material layers 6325 to 6328 may be spaced from the first to fourth conductive material layers 6321 to 6324 in the Y-direction.

A plurality of lower pillars DP may be formed to penetrate the first to fourth conductive material layers 6321 to 6324. Each of the lower pillars DP may be extended in the Z-direction. A plurality of upper pillars UP may be formed to penetrate the fifth to eighth conductive material layers 6325 to 6328. Each of the upper pillars UP may be extended in the Z-direction.

Each of the lower pillars DP and the upper pillars UP may include an internal material layer 6361, a middle layer 6362 and a surface layer 6363. The middle layer 6362 may serve as a channel of the cell transistor. The surface layer 6363 may include a blocking insulating layer, an electric charge storage layer, and a tunnel insulating layer.

The lower pillars DP and the upper pillars UP may be coupled through a pipe gate PG. The pipe gate PG may be formed in the substrate 6311. For example, the pipe gate PG may include substantially the same material as the lower pillars DP and the upper pillars UP.

A doping material layer 6312 doped with a second type impurity may be disposed over the lower pillars DP. The doping material layer 6312 may extend in the X direction and the Y direction. For example, the doping material layer 6312 doped with the second type impurity may include an n-type silicon material. The doping material layer 6312 doped with the second type impurity may serve as the common source line CSL.

Drains 6340 may be formed over each of the upper pillars UP. For example, the drain 6340 may include an n-type silicon material. First and second upper conductive material layers 6351 and 6352 may be formed over the drains 6340. The first and second upper conductive material layers 6351 and 6352 may be extended in the Y-direction.

The first and second upper conductive material layers 6351 and 6352 may be spaced apart from each other in the X-direction. For example, the first and second upper conductive material layers 6351 and 6352 may be made of metal. For example, the first and second upper conductive material layers 6351 and 6352 may be coupled to the drains 6340 through contact plugs. The first and second upper conductive material layers 6351 and 6352 may serve as first and second bit lines BL1 and BL2, respectively.

The first conductive material layer 6321 may serve as the source select line SSL, and the second conductive material layer 6322 may serve as the first dummy word line DWL1, and the third and fourth conductive material layers 6323 and 6324 may serve as the first and second main word lines MWL1 and MWL2, respectively. The fifth and sixth conductive material layers 6325 and 6326 may serve respectively as the third and fourth main word lines MWL3 and MWL4, the seventh conductive material layer 6327 may serve as the second dummy word line DWL2, and the eighth conductive material layer 6328 may serve as the drain select line DSL.

Each of the lower pillars DP and the first to fourth conductive material layers 6321 to 6324 adjacent to the lower pillar DP may form a lower string. Each of the upper pillars UP and the fifth to eighth conductive material layers 6325 to 6328 adjacent to the upper pillar UP may form an upper string. The lower string and the upper string may be coupled through the pipe gate PG. One end of the lower string may be coupled to the second-type doping material layer 6312 serving as the common source line CSL. One end of the upper string may be coupled to a corresponding bit line through the drain 6340. The lower string and the upper string are coupled through the pipe gate PG. A single lower string and a single upper string may form a single cell string coupled between the second-type doping material layer 6312 serving as the common source line CSL and a corresponding one of the upper conductive material layers 6351 and 6352 serving as the bit line BL.

That is, the lower string may include the source select transistor SST, the first dummy memory cell DMC1, and the first and second main memory cells MMC1 and MMC2. The upper string may include the third and fourth main memory cells MMC3 and MMC4, the second dummy memory cell DMC2 and the drain select transistor DST.

Referring to FIGS. 14 and 15, the upper string and the lower string may form the NAND string NS having a plurality of transistor structures TS. The transistor structure TS may be substantially the same as the transistors described with reference to FIG. 12.

FIG. 16 is an equivalent circuit diagram illustrating the memory block BLKj described with reference to FIGS. 14 and 15. FIG. 16 exemplarily shows first and second strings among the strings included in the memory block BLKj.

Referring to FIG. 16, the memory block BLKj may include a plurality of cell strings, each of which comprises a single upper string and a single lower string that are coupled through the pipe gate PG, as described with reference to FIGS. 14 and 15.

In the memory block BLKj, memory cells CG0 to CG31 stacked along a first channel layer CH1 (not shown), one or more source selection gates SSG, and one or more drain selection gates DSG may form a first string ST1. Memory cells CG0 to CG31 stacked along a second channel layer CH2 (not shown), one or more source selection gates SSG, and one or more drain selection gates DSG may form a second string ST2.

The first and second strings ST1 and ST2 may be coupled to a single drain selection line DSL and a single source selection line SSL. The first string ST1 may be coupled to a first bit line BL1, and the second string ST2 may be coupled to a second bit line BL2.

FIG. 16 shows the first and second strings ST1 and ST2 coupled to a single drain selection line DSL and a single source selection line SSL. In another embodiment, the first and second strings ST1 and ST2 may be coupled to a single source selection line SSL and a single bit line BL. In such case, the first string ST1 may be coupled to the first drain selection line DSL1, and the second string ST2 may be coupled to the second drain selection line DSL2. In another embodiment, the first and second strings ST1 and ST2 may be coupled to a single drain selection line DSL and a single bit line BL. In such case, the first string ST1 may be coupled to the first source selection line SSL1, and the second string ST2 may be coupled to the second source selection line SSL2.

Figure 17:
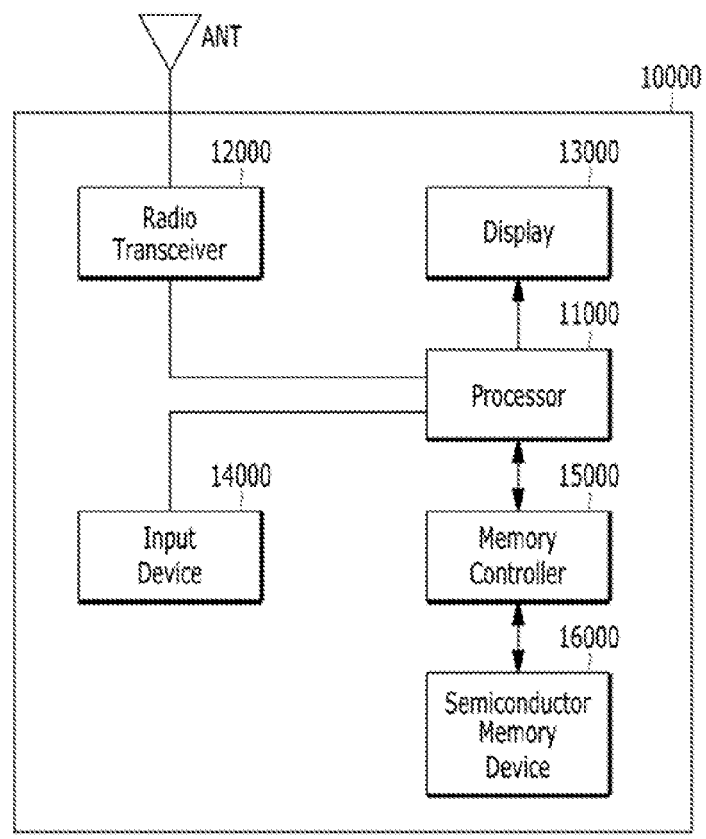
FIG. 17 is a block diagram schematically illustrating an electronic device including a semiconductor memory system in accordance with an embodiment of the present invention.

FIG. 17 is a block diagram schematically illustrating an electronic device 10000 including a memory controller 15000 and a semiconductor memory device 16000 in accordance with an embodiment of the present invention.

Referring to FIG. 17, the electronic device 10000 such as a cellular phone, a smart phone, or a tablet PC may include the semiconductor memory device 16000 implemented by a flash memory device and the memory controller 15000 to control the semiconductor memory device 16000.

The semiconductor memory device 16000 may correspond to the semiconductor memory device 200 described above with reference to FIGS. 3 to 13. The semiconductor memory device 16000 may store random data.

The memory controller 15000 may correspond to the memory controller described with reference to FIGS. 3 to 13. The memory controller 15000 may be controlled by a processor 11000 which controls overall operations of the electronic device 10000.

Data stored in the semiconductor memory device 16000 may be displayed through a display 13000 under the control of the memory controller 15000. The memory controller 15000 operates under the control of the processor 11000.

A radio transceiver 12000 may receive and output a radio signal through an antenna ANT. For example, the radio transceiver 12000 may convert the received radio signal from the antenna ANT into a signal to be processed by the processor 11000. Thus, the processor 11000 may process the converted signal from the radio transceiver 12000, and may store the processed signal at the semiconductor memory device 16000. Otherwise, the processor 11000 may display the processed signal through the display 13000.

The radio transceiver 12000 may convert a signal from the processor 11000 into a radio signal, and may output the converted radio signal to an external device through the antenna ANT.

An input device 14000 may receive a control signal for controlling operations of the processor 11000 or data to be processed by the processor 11000, and may be implemented by a pointing device such as a touch pad or a computer mouse, a key pad, or a keyboard.

The processor 11000 may control the display 13000 such that the data from the semiconductor memory device 16000, the radio signal from the radio transceiver 12000 or the data from the input device 14000 is displayed through the display 13000.

Figure 18:
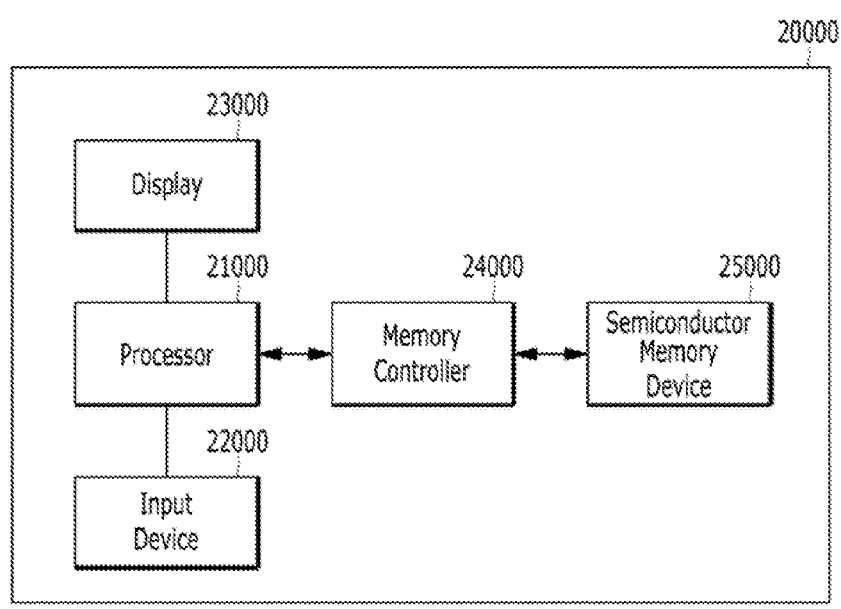
FIG. 18 is a block diagram schematically illustrating an electronic device including a semiconductor memory system in accordance with an embodiment of the present invention.

FIG. 18 is a block diagram schematically illustrating an electronic device 20000 including a memory controller 24000 and a semiconductor memory device 25000 in accordance with an embodiment of the present invention.

The memory controller 24000 and the semiconductor memory device 25000 may correspond to the memory controller 100 and the semiconductor memory device 200 described with reference to FIGS. 3 to 13, respectively.

Referring to FIG. 18, the electronic device 20000 may be implemented by a data processing device such as a personal computer (PC), a tablet computer, a net-book, an e-reader, a personal digital assistant (PDA), a portable multimedia player (PMP), an MP3 player, or an MP4 player, and may include the semiconductor memory device 25000, e.g., a flash memory device and a memory controller 24000 to control operations of the semiconductor memory device 25000.

The electronic device 20000 may include a processor 21000 to control overall operations of the electronic device 20000. The memory controller 24000 may be controlled by the processor 21000.

The processor 21000 may display data stored in the semiconductor memory device 25000 through a display 23000 according to an input signal from an input device 22000. For example, the input device 22000 may be implemented by a pointing device such as a touch pad or a computer mouse, a key pad, or a keyboard.

Figure 19:
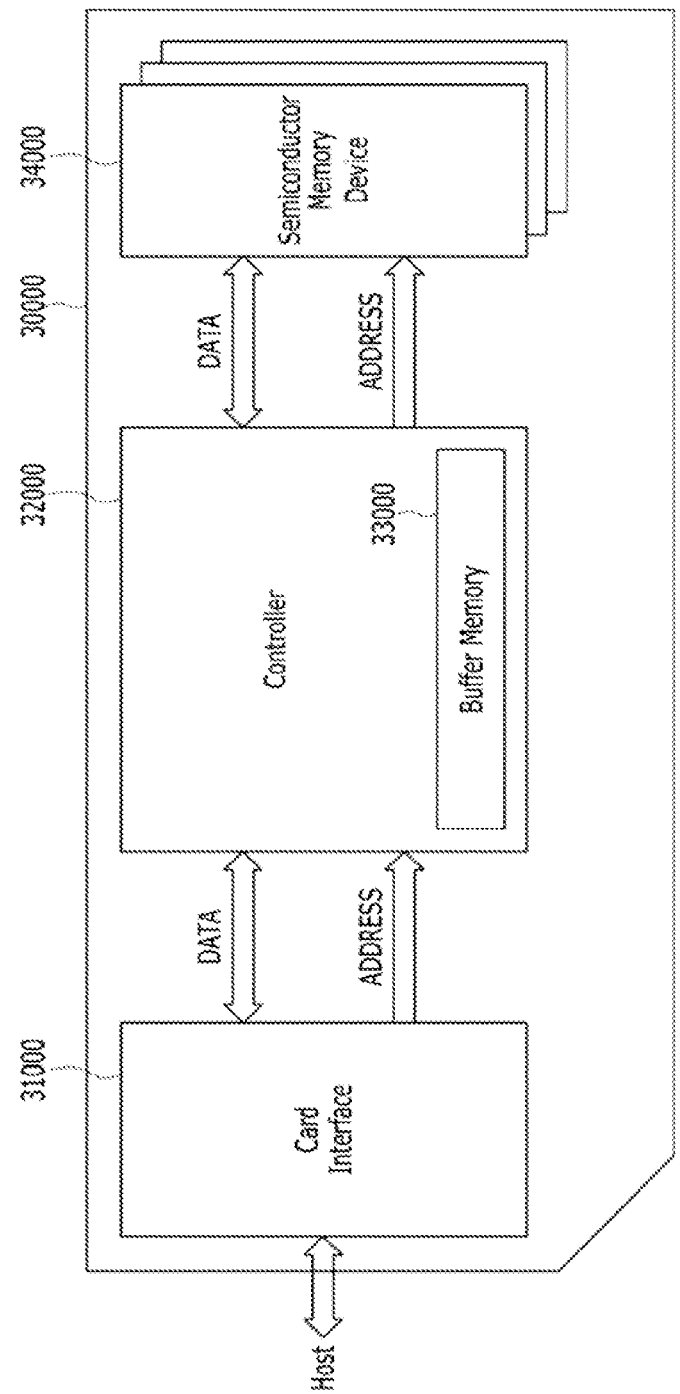
FIG. 19 is a block diagram schematically illustrating an electronic device including a semiconductor memory system in accordance with an embodiment of the present invention.

FIG. 19 is a block diagram schematically illustrating an electronic device 30000 including a controller 32000 and a semiconductor memory device 34000 in accordance with an embodiment of the present invention.

The controller 32000 and the semiconductor memory device 34000 may correspond to the memory controller 100 and the semiconductor memory device 200 described with reference to FIGS. 3 to 13, respectively.

Referring to FIG. 19, the electronic device 30000 may include a card interface 31000, the controller 32000, and the semiconductor memory device 34000, for example, a flash memory device.

The electronic device 30000 may exchange data with a host through the card interface 31000. The card interface 31000 may be a secure digital (SD) card interface or a multi-media card (MMC) interface, which does not limit the scope of the present invention. The card interface 31000 may interface the host and the controller 32000 according to a communication protocol of the host capable of communicating with the electronic device 30000.

The controller 32000 may control an overall operation of the electronic device 30000, and may control data exchange between the card interface 31000 and the semiconductor memory device 34000. A buffer memory 33000 of the controller 32000 may buffer data transferred between the card interface 31000 and the semiconductor memory device 34000.

The controller 32000 may be coupled with the card interface 31000 and the semiconductor memory device 34000 through a data bus DATA and an address bus ADDRESS. In accordance with an embodiment, the controller 32000 may receive an address of data, which is to be read or written, from the card interface 31000, through the address bus ADDRESS, and may send it to the semiconductor memory device 34000. Further, the controller 32000 may receive or transfer data to be read or written through the data bus DATA connected with the card interface 31000 or the semiconductor memory device 34000.

When the electronic device 30000 is connected with the host such as a PC, a tablet PC, a digital camera, a digital audio player, a mobile phone, console video game hardware or a digital set-top box, the host may exchange data with the semiconductor memory device 34000 through the card interface 31000 and the controller 32000.

Figure 20:
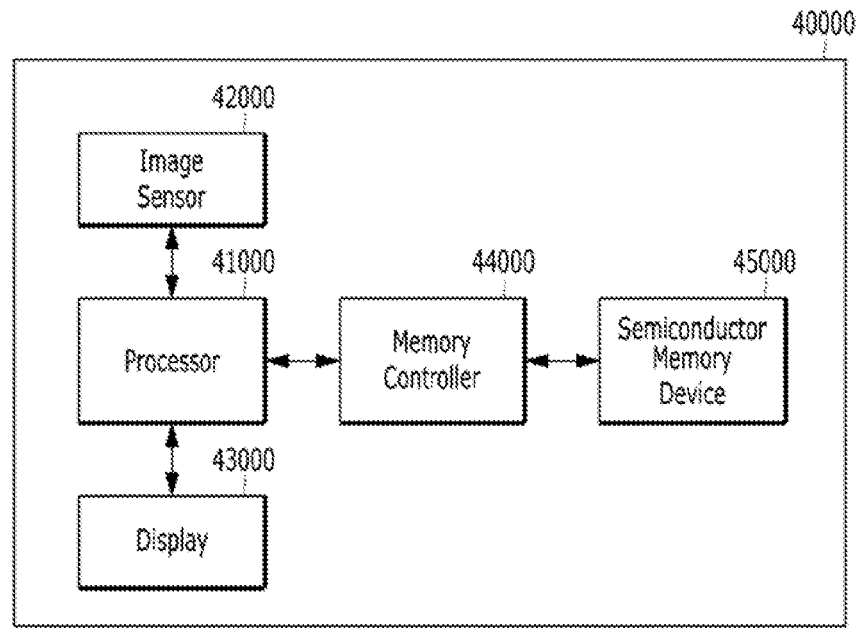
FIG. 20 is a block diagram schematically illustrating an electronic device including a semiconductor memory system in accordance with an embodiment of the present invention.

FIG. 20 is a block diagram schematically illustrating an electronic device 40000 including a memory controller 44000 and a semiconductor memory device 45000 in accordance with an embodiment of the present invention.

The memory controller 44000 and the semiconductor memory device 45000 may correspond to the memory controller 100 and the semiconductor memory device 200 described with reference to FIGS. 3 to 13, respectively.

Referring to FIG. 20, the electronic device 40000 may include the semiconductor memory device 45000, e.g., the flash memory device, the memory controller 44000 to control a data processing operation of the semiconductor memory device 45000, and a processor 41000 to control overall operations of the electronic device 40000.

Further, an image sensor 42000 of the electronic device 40000 may convert an optical signal into a digital signal, and the converted digital signal may be stored in the semiconductor memory device 45000 under the control of the processor 41000. Otherwise, the converted digital signal may be displayed through a display 43000 under the control of the processor 41000.

Figure 21:
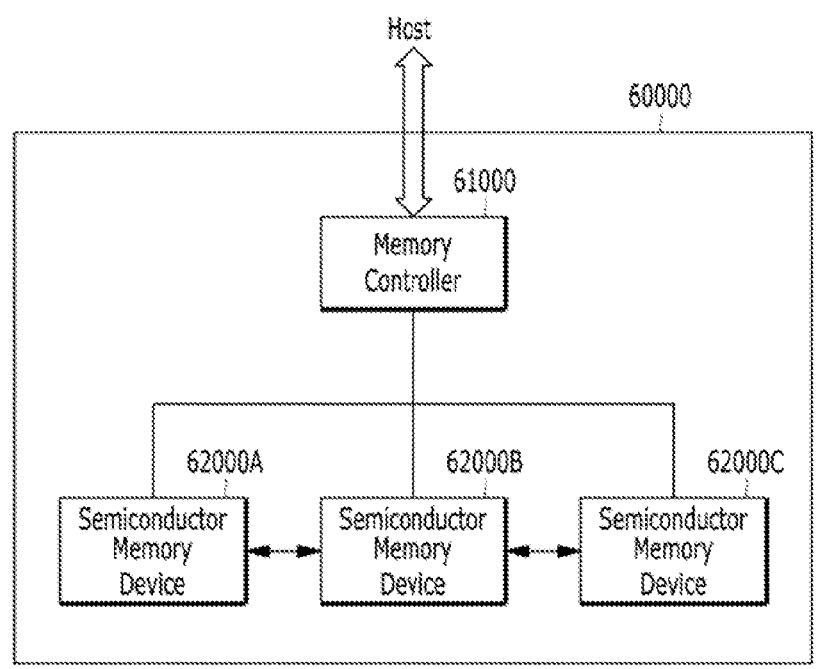
FIG. 21 is a block diagram schematically illustrating an electronic device including a semiconductor memory system in accordance with an embodiment of the present invention.

FIG. 21 is a block diagram schematically illustrating an electronic device 60000 including a memory controller 61000 and semiconductor memory devices 62000A, 62000B, and 62000C in accordance with an embodiment of the present invention.

The memory controller 61000 and each of the semiconductor memory devices 62000A, 62000B, and 62000C may correspond to the memory controller 100 and the semiconductor memory device 200 described with reference to FIGS. 3 to 13, respectively.

Referring to FIG. 21, the electronic device 60000 may be implemented by a data storage device such as a solid state drive (SSD).

The electronic device 60000 may include the plurality of semiconductor memory devices 62000A, 62000B, and 62000C and the memory controller 61000 to control a data processing operation of each of the plural semiconductor memory devices 62000A, 62000B, and 62000C.

The electronic device 60000 may be implemented by a memory system or a memory module.

For example, the memory controller 61000 may be implemented outside or inside the electronic device 60000.

Figure 22:
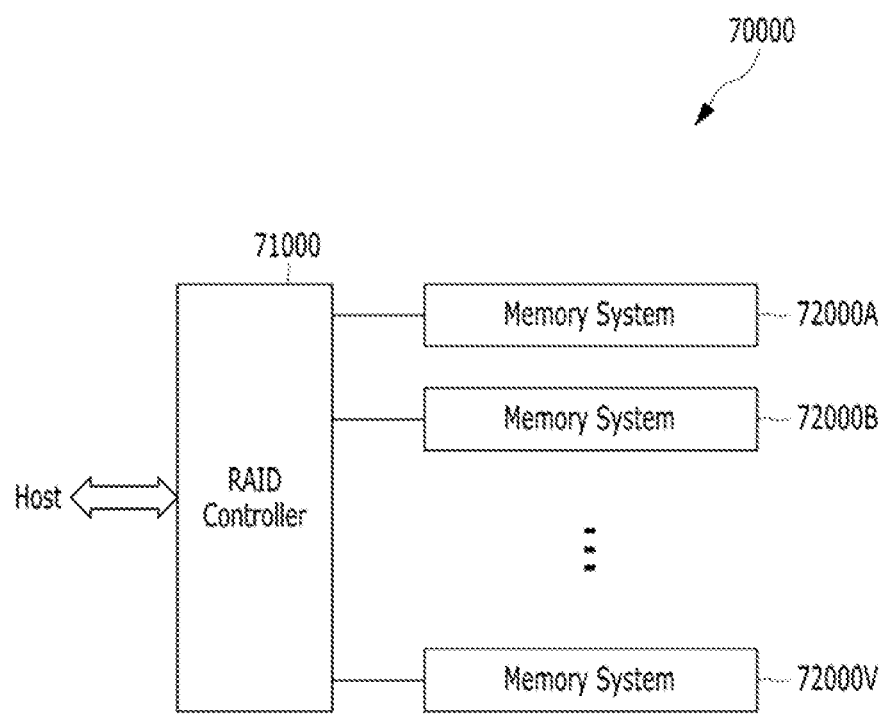
FIG. 22 is a block diagram of a data processing system including the electronic device shown in FIG. 21.

FIG. 22 is a block diagram of a data processing system including the electronic device 6000 described with reference to FIG. 21.

Referring to FIGS. 21 and 22, a data storage device 70000 may be implemented by a redundant array of independent disks (RAID) system. The data storage device 70000 may include a RAID controller 71000 and a plurality of memory systems 72000A to 72000N, where N is a natural number.

Each of the memory systems 72000A to 72000N may correspond to the electronic device 60000 described with reference to FIG. 21. The memory systems 72000A to 72000N may form a RAID array. The data storage device 70000 may be implemented by an SSD.

During a program operation, the RAID controller 71000 may output program data, which is output from a host, to one of the memory systems 72000A to 72000N according to one selected from a plurality of RAID levels based on RAID level information output from the host.

During a read operation, the RAID controller 71000 may transfer data, which is read from one of the memory systems 72000A to 72000N, to the host according to one of the RAID levels based on the RAID level information output from the host.

While the present invention has been described with respect to the specific embodiments, it will be apparent to those skilled in the art that various changes and modifications may be made without departing from the spirit and scope of the invention as defined in the following claims.

What is claimed is:

1. An operating method of a controller, comprising:
when a first ECC decoding on data read from a semiconductor memory device according to a hard read voltage fails, generating one or more quantization intervals based on a number of unsatisfied syndrome check (USC), which is a result of the first ECC decoding; and
performing a second ECC decoding on the data by generating soft read data according to soft read voltages determined by the hard read voltage and the quantization intervals.

2. The operating method of claim 1, wherein the first ECC decoding is a low density parity check (LDPC) decoding.

3. The operating method of the controller of claim 2, wherein the USC is a nonzero element of a vector generated by a syndrome check of the LDPC decoding.

4. The operating method of claim 3, wherein the first ECC decoding comprises:
performing the LDPC decoding by reading the data from the semiconductor memory device according to the hard read voltage; and
determining whether the first ECC decoding is successful based on the USC included in the vector generated by the syndrome check.

5. The operating method of claim 1, wherein the quantization intervals are generated based on the number of USC according to following equation, $$\Delta_i = a \times \text{USC}_{V1} + b \text{ [step]} \qquad \text{[Equation]}$$

wherein "$\Delta_i$" represents one of the quantization intervals, "i" represents an index for the quantization intervals, "$\text{USC}_{V1}$" represents the number of USC, and "a" and "b" are coefficient values that are obtained through a heuristic approach or from characteristics of the semiconductor memory device.

6. The operating method of claim 5, wherein the quantization intervals are generated based on a quantization interval table having the number of USC as its index and preset by the Equation.

7. The operating method of claim 1, wherein the second ECC decoding is performed on the data read from the semiconductor memory device in response to the soft read voltages, each of which is spaced apart in voltage level from the hard read voltage by a corresponding one of the quantization intervals.

8. The operating method of claim 7, wherein the second ECC decoding is performed on the data read from the semiconductor memory device according to each of the soft read voltages until the second ECC decoding is successful.

9. The operating method of claim 1,
wherein the first ECC decoding is a hard decision decoding, and
wherein the second ECC decoding is a soft decision decoding.

10. A controller comprising:
a quantization interval generation unit for generating one or more quantization intervals based on a number of unsatisfied syndrome check (USC), which is a result of a first ECC decoding on data read from a semiconductor memory device according to a hard read voltage, when the first ECC decoding fails; and
an ECC unit for performing a second ECC decoding on the data by generating soft read data according to soft read voltages determined by the hard read voltage and the quantization intervals.

11. The controller of claim 10, wherein the first ECC decoding is a low density parity check (LDPC) decoding.

12. The controller of claim 11, wherein the USC is a nonzero element of a vector generated by a syndrome check of the LDPC decoding.

13. The controller of claim 12, wherein:
the LDPC decoding is performed by reading the data from the semiconductor memory device according to the hard read voltage; and
whether the first ECC decoding is successful is determined based on the USC included in the vector generated by the syndrome check.

14. The controller of claim 10, wherein the quantization interval generation unit for generating the quantization intervals generates the quantization intervals based on the number of USC according to following equation, $$\Delta_i = a \times \text{USC}_{V1} + b \text{ [step]} \qquad \text{[Equation]}$$

wherein "$\Delta_i$" represents one of the quantization intervals, "i" represents index for the quantization intervals, "$\text{USC}_{V1}$" represents the number of USC, and "a" and "b" are coefficient values that are obtained through a heuristic approach or from characteristics of the semiconductor memory device.

15. The controller of claim 14, wherein the quantization interval generation unit for generating the quantization intervals generates the quantization intervals based on a quantization interval table having the number of USC as its index and is preset by the Equation.

16. The controller of claim 10, wherein the ECC unit for performing the second ECC decoding performs the second ECC decoding on the data read from the semiconductor memory device according to the soft read voltages, each of which is spaced apart in voltage level from the hard read voltage by a corresponding one of the quantization intervals.

17. The controller of claim 16, wherein the ECC unit for performing the second ECC decoding performs the second ECC decoding on the data read from the semiconductor memory device according to each of the soft read voltages until the second ECC decoding is successful.

18. The controller of claim 10,
wherein the first ECC decoding is a hard decision decoding, and
wherein the second ECC decoding is a soft decision decoding.

19. A semiconductor memory system comprising:
a semiconductor memory device; and
a controller,
wherein the controller comprises:
a quantization interval generation unit for generating one or more quantization intervals based on a number of unsatisfied syndrome check (USC), which is a result of a first ECC decoding on data read from the semiconductor memory device according to a hard read voltage, when the first ECC decoding fails; and an ECC unit for performing a second ECC decoding on the data by generating soft read data according to soft read voltages determined by the hard read voltage and the quantization intervals.

20. The semiconductor memory system of claim 19, wherein the USC is a nonzero element of a vector generated by a syndrome check of a low density parity check (LDPC) decoding.

* * * * *